United States Patent
Shi et al.

(10) Patent No.: US 10,968,243 B2
(45) Date of Patent: Apr. 6, 2021

(54) ORGANOMETALLIC COMPLEX AND APPLICATION THEREOF IN ELECTRONIC DEVICES

(71) Applicant: GUANGZHOU CHINARAY OPTOELECTRONIC MATERIALS LTD., Guangdong (CN)

(72) Inventors: Chao Shi, Guangdong (CN); Junyou Pan, Guangdong (CN)

(73) Assignee: GUANGZHOU CHINARAY OPTOELECTRONIC MATERIALS LTD., Guangdong (CN)

( * ) Notice: Subject to any disclaimer, the term of this patent is extended or adjusted under 35 U.S.C. 154(b) by 277 days.

(21) Appl. No.: 15/781,200

(22) PCT Filed: Nov. 4, 2016

(86) PCT No.: PCT/CN2016/104732
§ 371 (c)(1),
(2) Date: Jun. 4, 2018

(87) PCT Pub. No.: WO2017/092545
PCT Pub. Date: Jun. 8, 2017

(65) Prior Publication Data
US 2019/0241590 A1    Aug. 8, 2019

(30) Foreign Application Priority Data

Dec. 4, 2015 (CN) .................. 201510888816.7

(51) Int. Cl.
| C07F 15/00 | (2006.01) |
| C09K 11/06 | (2006.01) |
| H01L 51/50 | (2006.01) |
| C09D 11/03 | (2014.01) |
| C09D 11/30 | (2014.01) |
| C09D 5/22 | (2006.01) |
| H01L 51/00 | (2006.01) |

(52) U.S. Cl.
CPC ......... *C07F 15/0033* (2013.01); *C09D 5/22* (2013.01); *C09D 11/03* (2013.01); *C09D 11/30* (2013.01); *C09K 11/06* (2013.01); *H01L 51/0085* (2013.01); *H01L 51/50* (2013.01); *H01L 51/5012* (2013.01); *H01L 51/5056* (2013.01); *H01L 51/5072* (2013.01)

(58) Field of Classification Search
CPC combination set(s) only.
See application file for complete search history.

(56) References Cited

U.S. PATENT DOCUMENTS

| 6,420,057 | B1* | 7/2002 | Ueda ............... C09K 11/06 252/301.16 |
| 6,824,895 | B1 | 11/2004 | Sowinski et al. |
| 6,830,828 | B2 | 12/2004 | Thompson et al. |
| 6,835,469 | B2 | 12/2004 | Kwong et al. |
| 7,029,766 | B2 | 4/2006 | Huo et al. |
| 2001/0053462 | A1 | 12/2001 | Mishima |
| 2004/0230061 | A1 | 11/2004 | Seo et al. |
| 2005/0258742 | A1 | 11/2005 | Tsai et al. |
| 2007/0087219 | A1 | 4/2007 | Ren et al. |
| 2007/0252517 | A1 | 11/2007 | Owczarczyk et al. |
| 2008/0027220 | A1 | 1/2008 | Stossel et al. |
| 2009/0061681 | A1 | 3/2009 | McMunigal et al. |
| 2009/0134784 | A1 | 5/2009 | Lin et al. |
| 2011/0284799 | A1 | 11/2011 | Stoessel et al. |
| 2012/0004407 | A1 | 1/2012 | Stoessel et al. |
| 2012/0217869 | A1 | 8/2012 | Adachi et al. |
| 2013/0048963 | A1* | 2/2013 | Beers ............... C09K 11/06 257/40 |
| 2014/0027716 | A1 | 1/2014 | Tsai et al. |
| 2014/0138669 | A1 | 5/2014 | Nakagawa et al. |

(Continued)

FOREIGN PATENT DOCUMENTS

| CN | 1609101 A | 4/2005 |
| CN | 1751055 A | 3/2006 |

(Continued)

OTHER PUBLICATIONS

M. Trivedi, et al., "Imidazole containing palladium(II) complexes as efficient pre-catalyst systems for Heck and Suzuki coupling reaction: Synthesis, structural characterization and catalytic properties", Inorganica Chimica Acta 394, p. 107-119 (Year: 2013).*

(Continued)

*Primary Examiner* — Eric R Smith
(74) *Attorney, Agent, or Firm* — Hamre, Schumann, Mueller & Larson, P.C.

(57) ABSTRACT

Disclosed are an organometallic complex comprising a new six-membered N-heterocyclic ligand, and an application thereof in an organic electronic device, especially in a phosphorescent organic light-emitting diode. The present invention further relates to an organic electronic device comprising the organometallic complex according to the present invention, especially an organic light-emitting diode, and an application thereof in display and illumination technology. In the present invention, the device structure is optimized and the concentration of the metal complex in the substrate is changed, so that the device achieves the optimal performance, and an OLED device having high efficiency, high luminance and high stability is achieved, thereby providing a better choice of materials for full-colour display and illumination application.

16 Claims, No Drawings

(56) References Cited

U.S. PATENT DOCUMENTS

| | | | |
|---|---|---|---|
| 2014/0138670 A1 | 5/2014 | Nakagawa et al. | |
| 2015/0041784 A1 | 2/2015 | Shizu et al. | |
| 2015/0141642 A1 | 5/2015 | Adachi et al. | |
| 2016/0028026 A1* | 1/2016 | Das | C07F 15/0033 257/40 |

FOREIGN PATENT DOCUMENTS

| | | |
|---|---|---|
| CN | 102282150 A | 12/2011 |
| CN | 103483332 A | 1/2014 |
| CN | 104177436 A | 12/2014 |
| EP | 1191613 B1 | 3/2006 |
| EP | 1191612 B1 | 5/2009 |
| EP | 1191614 B1 | 9/2009 |
| JP | 2002117978 A | 4/2002 |
| TW | 201309696 A | 3/2013 |
| TW | 201309778 A | 3/2013 |
| TW | 201343874 A | 11/2013 |
| TW | 201350558 A | 12/2013 |
| WO | 200070655 A2 | 11/2000 |
| WO | 200141512 A1 | 6/2001 |
| WO | 200202714 A2 | 1/2002 |
| WO | 200215645 A1 | 2/2002 |
| WO | 2005019373 A2 | 3/2005 |
| WO | 2005033244 A1 | 4/2005 |
| WO | 2007095118 A2 | 8/2007 |
| WO | 2009118087 A1 | 10/2009 |
| WO | 2009146770 A2 | 12/2009 |
| WO | 2010015307 A1 | 2/2010 |
| WO | 2010031485 A1 | 3/2010 |
| WO | 2010054728 A1 | 5/2010 |
| WO | 2010054731 A1 | 5/2010 |
| WO | 2010086089 A1 | 8/2010 |
| WO | 2010099852 A1 | 9/2010 |
| WO | 2010102709 A1 | 9/2010 |
| WO | 2010135519 A1 | 11/2010 |
| WO | 2011110277 A1 | 9/2011 |
| WO | 2011141110 A2 | 11/2011 |
| WO | 2011157339 A1 | 12/2011 |
| WO | 2012007086 A1 | 1/2012 |
| WO | 2012007087 A1 | 1/2012 |
| WO | 2012007088 A1 | 1/2012 |
| WO | 2013133359 A1 | 9/2013 |
| WO | 2013154064 A1 | 10/2013 |

OTHER PUBLICATIONS

P. Subramanian, K. Kaliappan, "A unified strategy towards N-aryl heterocycles by a one-pot copper catalyzed oxidative C—H amination of azoles", European Journal of Organic Chemistry, p. 5986-5997 (Year: 2014).*

International Search Report and Written Opinion for Application No. PCT/CN2016/104732 dated Feb. 8, 2017 (6 pages).

Ed. George R. Newkome, Charles N. Moorefield, Fritz Vogtle, Dendrimers and Dendrons, Wiley-VCH Verlag GmbH & Co. KGaA, 2002, 320 pages.

Helmut Kipphan, Handbook of Print Media : Technologies and Production Methods, relevant passages Chapter 1.3 Printing Technologies (pp. 40-67), Chapter 1.5 Print Media Materials (117-144) and Chapter 5.5 Ink Jet (711-730), (2004).

M. A. Baldo, M. E. Thompson, S. R. Forrest, High-efficiency fluorescent organic light-emitting devices using a phosphorescent sensitizer, Nature 403, (2000), pp. 750-753.

Chihaya Adachi, Marc A. Baldo, Stephen R. Forrest, et. al., High-efficiency red electrophosphorescence devices, Appl. Phys. Lett. 78 (2001), pp. 1622-1624.

Junji Kido, Hiromichi Hayase, Kenichi Hongawa, et. al., Bright red lightemitting organic electroluminescent devices having a europium complex as an emitter, Appl. Phys. Lett. 65 (1994), pp. 2124-2126.

Junji Kido, Katsutoshi Nagai, Yutaka Ohashi, Electroluminescence in a Terbium Complex,Chemistry Letters, The Chemical Society of Japan, pp. 657-660, 1990.

Curtis E. Johnson, Richard Eisenberg, Ted R. Evans, et. al., Luminescent Iridium(I), Rhodium(I), and Platinum(II) Dithiolate Complexes, JACS vol. 105, No. 7, 1983, pp. 1795-1802.

Mark Wrighton, David L. Morse, The Nature of the Lowest Excited State in Tricarbonylchloro-1, 10-phenanthrolinerhenium(I) and Related Complexes, JACS 96:4, 1974, pp. 998-1003.

Yuguang Ma, Houyu Zhang, Jiacong Shen, et. al., Electroluminescence from triplet metal-ligand charge-transfer excited state of transition metal complexes, Synthetic Metals 94, 1998, pp. 245-248.

Ayataka Endo, Mai Ogasawara, Atsushi Takahashi, et. al., Thermally Activated Delayed Fluorescence from Sn4p—Porphyrin Complexes and Their Application to Organic Light-Emitting Diodes—A Novel Mechanism for Electroluminescence, Advanced Materials, 21, 2009, pp. 4802-4806.

Ayataka Endo, Keigo Sato, Kazuaki Yoshimura, et. al., Efficient up-conversion of triplet excitons into a singlet state and its application for organic light emitting diodes, American Institute of Physics, Applied Physics Letters 98, 2011, 083302-1 to p. 083302-3.

Sae Youn Lee, Takuma Yasuda, Hiroko Nomura, High-efficiency organic light-emitting diodes utilizing thermally activated delayed fluorescence from triazine-based donor-acceptor hybrid molecules, American Institute of Physics, Applied Physics Letters 101, 2012, p. 093306-1 to p. 093306-4.

Hiroyuki Tanaka, Katsuyuki Shizu, Hiroshi Miyazaki, Efficient green thermally activated delayed fluorescence (TADF) from a phenoxazine—triphenyltriazine (PXZ—TRZ) derivative, Chemical Communications, vol. 48, No. 93, 2012, pp. 11392-11394.

Kenichi Goushi, Kou Yoshida, Keigo Sato et.al., Organic light-emitting diodes employing efficient reverse intersystem crossing for triplet-to-singlet state conversion, Nature Photonics, vol. 6, 2012, pp. 253-258.

Hiroki Uoyama, Kenichi Goushi, Katsuyuki Shizu, Hiroko Nomura, et.al., Highly efficient organic light-emitting diodes from delayed fluorescence, Nature, vol. 492, 2012, pp. 234-238.

Qisheng Zhang, Jie Li, Katsuyuki Shizu, et.al., Design of Efficient Thermally Activated Delayed Fluorescence Materials for Pure Blue Organic Light Emitting Diodes, Journal of the American Chemical Society, 134, 2012, pp. 14706-14709.

Gábor Méhes, Hiroko Nomura, Qisheng Zhang, et.al., Enhanced Electroluminescence Efficiency in a Spiro-Acridine Derivative through Thermally Activated Delayed Fluorescence, Angew. Chem. Int. Ed, 51, 2012, pp. 11311-11315.

Tetsuya Nakagawa,a Sung-Yu Ku,b Ken-Tsung Wong, et.al., Electroluminescence based on thermally activated delayed fluorescence generated by a spirobifluorene donor-acceptor structure, Chem. Commun., 48, 2012, pp. 9580-9582.

Keiro Nasu,a Tetsuya Nakagawa,a Hiroko Nomura, et.al., A highly luminescent spiro-anthracenone-based organic light-emitting diode exhibiting thermally activated delayed fluorescence, Chem. Commun., 49, 2013, 3 pages.

Jie Li, Tetsuya Nakagawa, Qisheng Zhang, et.al.,Highly Efficient Organic Light-Emitting Diode Based on a Hidden Thermally Activated Delayed Fluorescence Channel in a Heptazine Derivative, Adv. Mater., 25, 2013, 5 pages.

Fernando B. Dias, Konstantinos N. Bourdakos, Vygintas Jankus, et.al., Triplet Harvesting with 100% Effi ciency by Way of Thermally Activated Delayed Fluorescence in Charge Transfer OLED Emitters, Adv. Mater., 25, 2013, pp. 3707-3714.

Takeshi Komino, Hiroko Nomura, Takahiro Koyanagi, et.al., Suppression of Efficiency Roll-Off Characteristics in Thermally Activated Delayed Fluorescence Based Organic Light-EmittingDiodes Using Randomly Oriented Host Molecules, Chemistry of Materials, 25, 2013, pp. 3038-3047.

Hiroyuki Tanaka, Katsuyuki Shizu, Hajime Nakanotani, et.al., Twisted Intramolecular Charge Transfer State for Long-Wavelength Thermally Activated Delayed Fluorescence, Chem. Mater., 25, 2013, pp. 3766-3771.

Jiyoung Lee, Katsuyuki Shizu, Hiroyuki Tanaka, et.al., Oxadiazole- and triazole-based highly-efficient thermally activated delayed fluorescence emitters for organic light-emitting diodes, J. Mater. Chem. C., 1, 2013, 6 pages.

(56) References Cited

OTHER PUBLICATIONS

Ryoichi Ishimatsu, Shigeyuki Matsunami, Katsuyuki Shizu, et.al., Solvent Effect on Thermally Activated Delayed Fluorescence by 1,2,3,5-Tetrakis(carbazol-9-yl)-4,6-dicyanobenzene, J. Phys. Chem. A., 117, 2013, pp. 5607-5612.

V. Bulovic, G. Gu, P. E. Burrows, et. al., Transparent light-emitting devices, Nature, vol. 380, 1996, p. 29.

G. Gu, V. Bulovic, P. E. Burrows, et. al., Transparent organic light emitting devics, Appl. Phys. Lett. vol. 68, No. 19, 1996, pp. 2606-2608.

Office Action issued for Chinese Patent Application No. 201680059929.9, dated Nov. 12, 2019, 11 pages including English translation.

\* cited by examiner

ORGANOMETALLIC COMPLEX AND APPLICATION THEREOF IN ELECTRONIC DEVICES

TECHNICAL FIELD

The present disclosure relates to an organometallic complex comprising a novel N-hetero six-membered ring ligand, and a use thereof in organic electronic devices, especially in organic phosphorescent light-emitting diodes. The present disclosure further relates to an organic electronic device comprising the organometallic complex, especially for a light-emitting device comprising the organometallic complex, and an application thereof in displays and lighting devices.

BACKGROUND

Organic light-emitting diode (OLED) made of organic semiconductive materials has showed great potential in applications of optoelectronic devices (such as flat-panel displays and lighting) because of the synthetic diversity, relatively low manufacturing costs, and excellent optical and electronic properties of organic semiconductive materials.

To improve the luminous efficiency of organic light-emitting diode, various luminescent materials based on fluorescence and phosphorescence have been developed. Fluorescent materials based organic light-emitting diodes possess high reliability, but their internal electroluminescence quantum efficiency is limited to 25% under electrical excitation, because the probability ratio of singlet excited state and triplet excited state is 1:3. In 1999, Professor Thomson from the University of Southern California and Professor Forrest from Princeton University incorporated tris (2-phenylpyridine)-iridium Ir (ppy)$_3$ into N, N-dicarbazole biphenyl (CBP), and successfully prepared green electroluminescent devices, which aroused a great interest in organometallic complex phosphorescent materials. The introduction of heavy metals can improve the molecular spin orbit coupling, shorten the lifetime of the triplet excited state and enhance the intersystem crossing of molecules, so that the phosphorescence can be successfully realized. Furthermore, the synthetic reaction condition of this kind of complex are mild, thus it is easy to change the complex structure and the substituent group and regulate the emission wavelength, and thus get the excellent performance of the electroluminescent material. So far, the internal quantum efficiency of phosphorescent OLED is close to 100%. However, the stability of phosphorescent OLED needs to be improved. The stability of the phosphorescent OLED depends largely on the luminous body itself. Most of the widely used iridium and platinum metal complexes are mostly confined to the five-membered ring ligands, while the metal complexes comprising six-membered ring ligands with good structural stability are less. To further improve the material properties and broaden the choice of phosphorescent metal complexes materials, it is urgently needed to develop highly efficient novel ligands based phosphorescent metal complexes.

SUMMARY OF THE INVENTION

In view of the above, the object of the present disclosure is to provide an organometallic complex comprising N-hetero six-membered ring ligand, which can effectively improve the stability of the complex material, luminous efficiency and the performance of the corresponding device due to its excellent rigidity, chemical and thermal stability.

According to one aspect of the present disclosure, an organometallic complex with the structural features represented by the general formula (1) is provided:

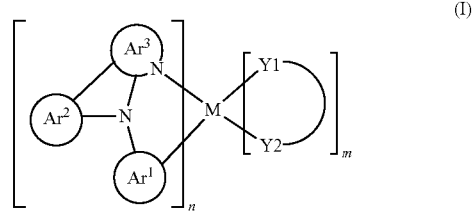

(I)

wherein,

M is a transition metal element;

m is an integer from 0 to 2, and n is an integer from 1 to 3;

when n≥1, each of Ar$^1$ and Ar$^2$ is independently selected from the same or different aromatic hydrocarbon or heteroaromatic cyclic hydrocarbon system which is not substituted or is substituted by R$^1$; Ar$^3$; is selected from a heteroaromatic cyclic hydrocarbon system containing at least one N, and is not substituted or is substituted by R$^1$;

R$_1$ is selected from the group consisting of: H; D; linear alkyl containing 1 to 20 carbon atoms, linear alkoxy containing 1 to 20 carbon atoms or linear thioalkoxy containing 1 to 20 carbon atoms; branched or cyclic alkyl containing 3 to 20 carbon atoms, branched or cyclic alkoxy containing 3 to 20 carbon atoms, branched or cyclic thioalkoxy containing 3 to 20 carbon atoms or branched or cyclic silyl containing 3 to 20 carbon atoms; a substituted keto group containing 1 to 20 carbon atoms; alkoxycarbonyl containing 2 to 20 carbon atoms; aryloxycarbonyl containing 7 to 20 carbon atoms; cyano; carbamoyl; haloformyl; formyl; isocyano; an isocyanate group; a thiocyanate group; an isothiocyanate group; hydroxy; nitro; CF$_3$; Cl; Br; F; a cross-linkable group; a substituted or unsubstituted aromatic or heteroaromatic ring system containing 5 to 40 ring-forming atoms; and aryloxy or heteroaryloxy containing 5 to 40 ring-forming atoms; and

is a bidentate ligand.

In some embodiments, the organometallic complex is represented by the following general formulas:

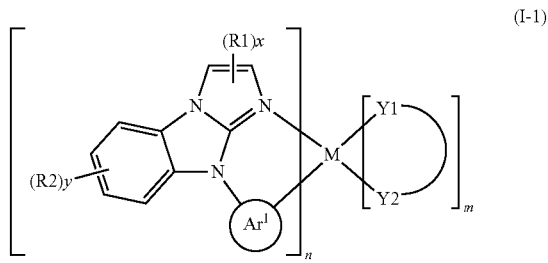

(I-1)

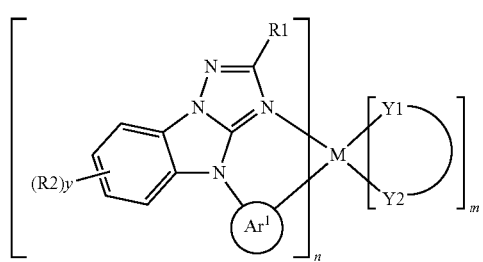

(I-2)

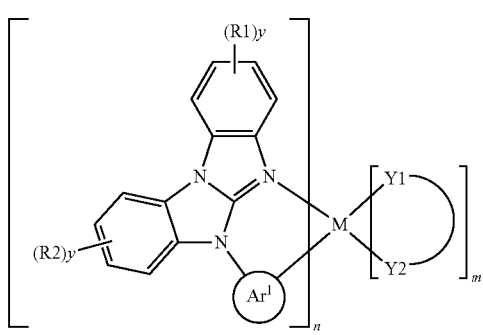

(I-3)

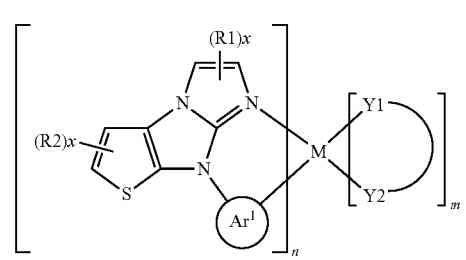

(I-4)

wherein x is an integer from 0 to 2, y is an integer from 0 to 4, and wherein R1 and R2 are each independently selected from any one of the group consisting of: H; F; Cl; Br; I; D; CN; $NO_2$; $CF_3$; $B(OR^2)_2$; $Si(R^2)_3$; linear alkane; alkane ether; alkane thioether containing 1 to 10 carbon atoms; branched alkane; cycloalkane; and aryl containing 6 to 10 carbon atoms.

According to the organometallic complex with the structural features represented by the general formula (1) of the present disclosure, wherein when n>1, the $Ar^1$ is independently selected from any one of the general formula C1 to C5, wherein $R^3$ to $R^{19}$ are selected from the group consisting of: H; F; Cl; Br; I; D; CN; $NO_2$; $CF_3$; $B(OR^2)_2$; $Si(R^2)_3$; linear alkane; alkane ether; alkane thioether containing 1 to 10 carbon atoms; branched alkane; cycloalkane; and aryl containing 6 to 10 carbon atoms, wherein the dashed lines indicate that connection is carried out in the form of a single bond,

C1

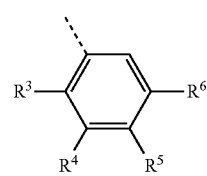

C2

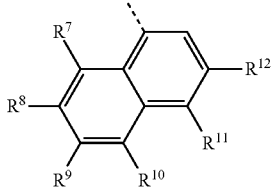

C3

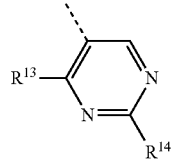

C4

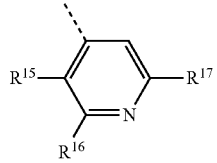

C5

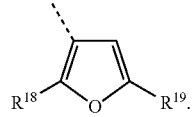

According to the organometallic complex of the present disclosure, wherein

is a monoanionic ligand, which is independently selected from any one of the following general formula L1 to L15 when m>1, wherein $R^{20}$ to $R^{89}$ are selected from the group consisting of: H; F; Cl; Br; I; D; CN; $NO_2$; $CF_3$; $B(OR^2)_2$; $Si(R^2)_3$; linear alkane; alkane ether; alkane thioether containing 1 to 10 carbon atoms; branched alkane; cycloalkane; and aryl containing 6 to 10 carbon atoms, wherein the dashed lines indicate a single bond connected to the metal element M,

L1

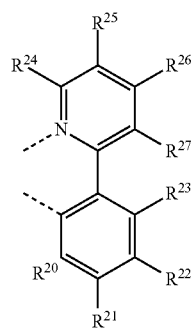

L2
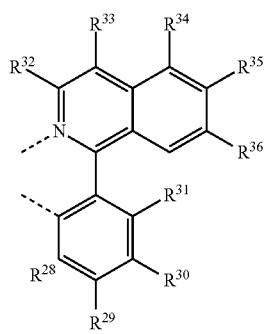
L3
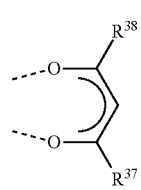
L4
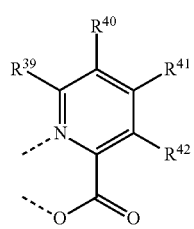
L5
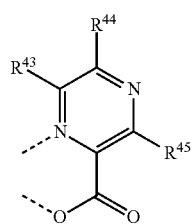
L6
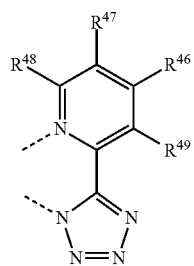
L7
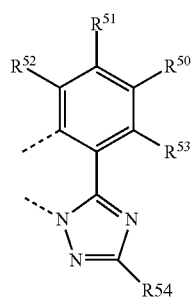
L8
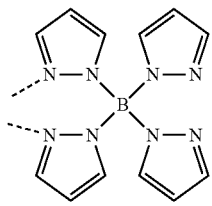
L9
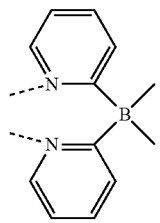
L10
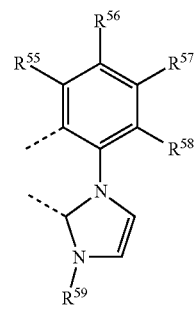
L11
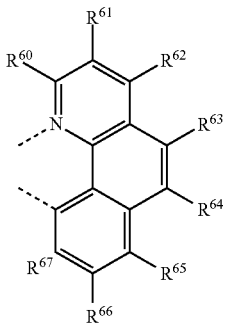
L12
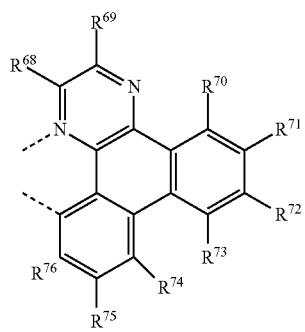

-continued

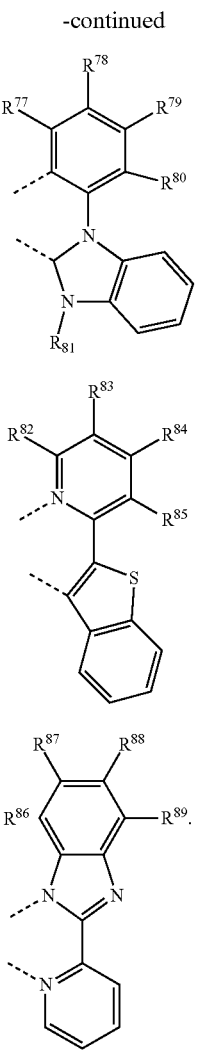

L13

L14

L15

According to the organometallic complex of the present disclosure, the metal element M is any one transition metal selected from the group consisting of: chromium (Cr), molybdenum (Mo), tungsten (W), ruthenium (Ru), rhodium (Rh), nickel (Ni), argentum (Ag), copper (Cu), zinc (Zn), palladium (Pd), gold (Au), osmium (Os), rhenium (Re), iridium (Ir), and platinum (Pt). In a particular embodiment, M is selected from the group consisting of Ir and Pt.

According to another aspect of the present disclosure, there is provided a polymer in which a repeating unit comprises the structural features of the organometallic complex as described above.

According to a further aspect of the present disclosure, there is provided a mixture comprising the organometallic complex or polymer as described above, and at least one organic functional material. The organic functional material may be selected from the group consisting of a hole-injection material (HIM), a hole-transport material (HTM), an electron-transport material (ETM), an electron-injection material (EIM), an electron-blocking material (EBM), a hole-blocking material (HBM), a light-emitting material (an emitter), a host material (Host) and an organic dye, etc.

According to yet another aspect of the present disclosure, there is provided a formulation comprising the organometallic complex or the polymer according to the present disclosure, and at least one organic solvent.

According to still another aspect of the present disclosure, there is provided an application of the organometallic complex or the polymer according to the present disclosure in organic electronic devices.

According to another aspect of the present disclosure, there is provided an organic electronic device comprising at least the organometallic complex and/or the polymer according to the present disclosure.

The organic electronic device may be selected from the group consisting of: an organic light-emitting diode (OLED), an organic photovoltaic cell (OPV), an organic light-emitting electrochemical cell (OLEEC), an organic field-effect transistor (OFET), an organic light-emitting field-effect transistor, an organic laser, an organic spin electronic device, an organic sensor and an organic plasmon emitting diode. The organic light-emitting diode (OLED) is particularly preferred.

DETAILED DESCRIPTION OF THE EMBODIMENTS

To facilitate understanding of the present disclosure, the disclosure will be described more fully hereinafter. Many embodiments of the present disclosure are provided hereinafter. However, the present disclosure may be embodied in many different forms and should not be construed as being limited to the embodiments set forth herein. Rather, these embodiments are provided for the purpose of more thorough and comprehensive understanding of the present disclosure.

Unless otherwise defined, all terms (including technical and scientific terms) used herein have the same meaning as commonly understood by one with ordinary skill in the art to which this disclosure belongs. The terminology used herein is for the purpose of describing specific embodiments only and is not intended to limit the disclosure. As used herein, the term "and/or" includes any and all combinations of one or more of the associated listed items.

The present disclosure relates to an organometallic complex with structural features represented by general formula (1):

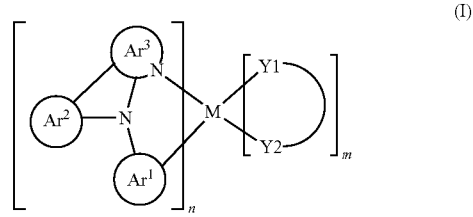

(I)

wherein,

M is a transition metal element;

m is an integer from 0 to 2, and n is an integer from 1 to 3;

when n≥1, each of $Ar^1$ and $Ar^2$ is independently selected from the same or different aromatic hydrocarbon or heteroaromatic cyclic hydrocarbon system which is not substituted or is substituted by $R^1$; and $Ar^3$ is selected from a heteroaromatic cyclic hydrocarbon system containing at least one N, and is not substituted or is substituted by $R^1$;

$R_1$ is selected from the group consisting of: H; D; linear alkyl containing 1 to 20 carbon atoms, linear alkoxy containing 1 to 20 carbon atoms or linear thioalkoxy containing 1 to 20 carbon atoms; branched or cyclic alkyl containing 3 to 20 carbon atoms, branched or cyclic alkoxy containing 3 to 20 carbon atoms containing 3 to 20 carbon atoms, branched or cyclic thioalkoxy containing 3 to 20 carbon atoms or branched or cyclic silyl containing 3 to 20 carbon atoms; a substituted keto group containing 1 to 20 carbon atoms; alkoxycarbonyl containing 2 to 20 carbon atoms; aryloxycarbonyl containing 7 to 20 carbon atoms; cyano; carbamoyl; haloformyl; formyl; isocyano; an isocyanate group; a thiocyanate group; an isothiocyanate group; hydroxy; nitro; CF$_3$; Cl; Br; F; a crosslinkable group; a substituted or unsubstituted aromatic or heteroaromatic ring system containing 5 to 40 ring-forming atoms; and aryloxy or heteroaryloxy containing 5 to 40 ring-forming atoms; and

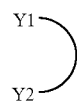

is a bidentate ligand.

In some embodiments, there is provided an organometallic complex with a general formula (I), wherein Ar$^1$ and Ar$^2$ are selected from unsubstituted or substituted aromatic or heteroaromatic rings containing 5 to 22 ring atoms in one embodiment, 5 to 18 ring atoms in another embodiment, and 5 to 12 ring atoms in a particular embodiment.

In some embodiments, there is provided an organometallic complex having a general formula (I), wherein Ar$^3$ is selected from unsubstituted or substituted heteroaromatic rings comprising at least one heteroatom N and containing 5 to 22 ring atoms in one embodiment, 5 to 18 ring atoms in another embodiment, and 5 to 12 ring atoms in a particular embodiment.

An aromatic group refers to a hydrocarbon group containing at least one aromatic ring, and includes a ring system formed by monocyclic groups and polycyclic rings. A heteroaromatic group refers to a hydrocarbon group (containing heteroatoms) containing at least one heteroaromatic ring, and includes a ring system formed by monocyclic groups and polycyclic rings. The ring system of these polycyclic rings may contain two or more rings, wherein two carbon atoms are shared by two adjacent rings, i.e., condensed rings. At least one of these rings in the ring system is aromatic or heteroaromatic. For the purpose of the present disclosure, the aromatic or heteroaromatic ring system includes not only an aromatic or heteroaromatic system, and a plurality of aryl groups or heteroaryl groups therein may also be interrupted by shorter non-aromatic units (<10% of non-H atoms, less than 5% of the non-H atoms in one embodiment, such as C, N or O atoms). Therefore, for the purpose of the present disclosure, systems such as 9,9'-spirobifluorene, 9,9-diarylfluorene, triarylamine, diaryl ether and the like are also considered as aromatic ring systems.

Specifically, examples of aromatic groups include benzene, naphthalene, anthracene, phenanthrene, perylene, tetracene, pyrene, benzopyrene, triphenylene, acenaphthene, fluorene, and derivatives thereof.

Specifically, examples of heteroaromatic groups include furan, benzofuran, thiophene, benzothiophene, pyrrole, pyrazole, triazole, imidazole, oxazole, oxadiazole, thiazole, tetrazole, indole, carbazole, pyrroloimidazole, pyrrolopyrrole, thienopyrrole, thienothiophene, furopyrrole, furofuran, thienofuran, benzoisoxazole, benzoisothiazole, benzoimidazole, pyridine, pyrazine, pyridazine, pyrimidine, triazine, quinoline, isoquinoline, o-diazonaphthalene, quinoxaline, phenanthridine, perimidine, quinazoline, quinazolinone, and derivatives thereof.

In one embodiment, the organometallic complex has the general formula (I), wherein Ar$^1$ to Ar$^3$ may be selected from one of the following general formulas:

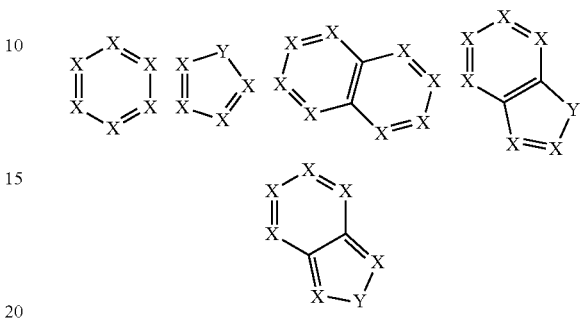

wherein,

X is CR$^1$ or N, and for Ar$^3$, at least one X is N;

Y is selected from the group consisting of CR$^2$R$^3$, SiR$^2$R$^3$, NR$^2$, C(=O), S, and O;

R$^1$, R$^2$, and R$^3$ are selected from the group consisting of: H or D; linear alkyl containing 1 to 20 carbon atoms, linear alkoxy containing 1 to 20 carbon atoms or linear thioalkoxy groups containing 1 to 20 carbon atoms; branched or cyclic alkyl containing 3 to 20 carbon atoms, branched or cyclic alkoxy containing 3 to 20 carbon atoms, branched or cyclic thioalkoxy groups containing 3 to 20 carbon atoms or branched or cyclic silyl groups containing 3 to 20 carbon atoms; substituted keto groups containing 1 to 20 carbon atoms; alkoxycarbonyl groups containing 2 to 20 carbon atoms, aryloxycarbonyl groups containing 7 to 20 carbon atoms; carbamoyl groups (—C(=O)NH$_2$), haloformyl groups (—C(=O)—X, wherein X represents halogen atoms), formyl groups (—C(=O)—H); cyano groups (—CN), isocyano groups, isocyanate groups, thiocyanate groups, isothiocyanate groups; hydroxy groups, nitro groups, CF$_3$ groups, Cl, Br, F, crosslinkable groups, substituted or unsubstituted aromatic or heteroaromatic ring systems containing 5 to 40 ring atoms; and aryloxy or heteroaryloxy groups containing 5 to 40 ring atoms; or a combination of these systems, wherein one or more groups of R$^1$, R$^2$, and R$^3$ may form a monocyclic or polycyclic aliphatic or aromatic ring system with each other and/or with a ring bonded thereto.

In some embodiments, R$^1$, R$^2$, and R$^3$ are selected from the group consisting of: H, D; linear alkyl containing 1 to 10 carbon atoms, linear alkoxy containing 1 to 10 carbon atoms or linear thioalkoxy groups containing 1 to 10 carbon atoms; branched or cyclic alkyl containing 3 to 10 carbon atoms, branched or cyclic alkoxy containing 3 to 10 carbon atoms, branched or cyclic thioalkoxy groups containing 3 to 10 carbon atoms or branched or cyclic silyl groups containing 3 to 10 carbon atoms; substituted keto groups containing 1 to 10 carbon atoms; alkoxycarbonyl groups containing 2 to 10 carbon atoms, aryloxycarbonyl groups containing 7 to 10 carbon atoms; carbamoyl groups (—C(=O)NH$_2$), haloformyl groups (—C(=O)—X, wherein X represents halogen atoms), formyl groups (—C(=O)—H); cyano groups (—CN), isocyano groups, isocyanate groups, thiocyanate groups or isothiocyanate groups; hydroxyl groups, nitro groups, CF$_3$ groups, Cl, Br, F, crosslinkable groups, substituted or unsubstituted aromatic or heteroaromatic ring systems containing 5 to 20 ring atoms; and aryloxy or heteroaryloxy groups containing 5 to 20 ring atoms; or a combination of these systems, wherein one or more groups of $R^1$, $R^2$, and $R^3$ may form a monocyclic or polycyclic aliphatic or aromatic ring system with each other and/or with a ring bonded thereto.

In some embodiments, $Ar^1$ and $Ar^2$ in the general formula (I) may be selected from the following structural units, and they may be further substituted:

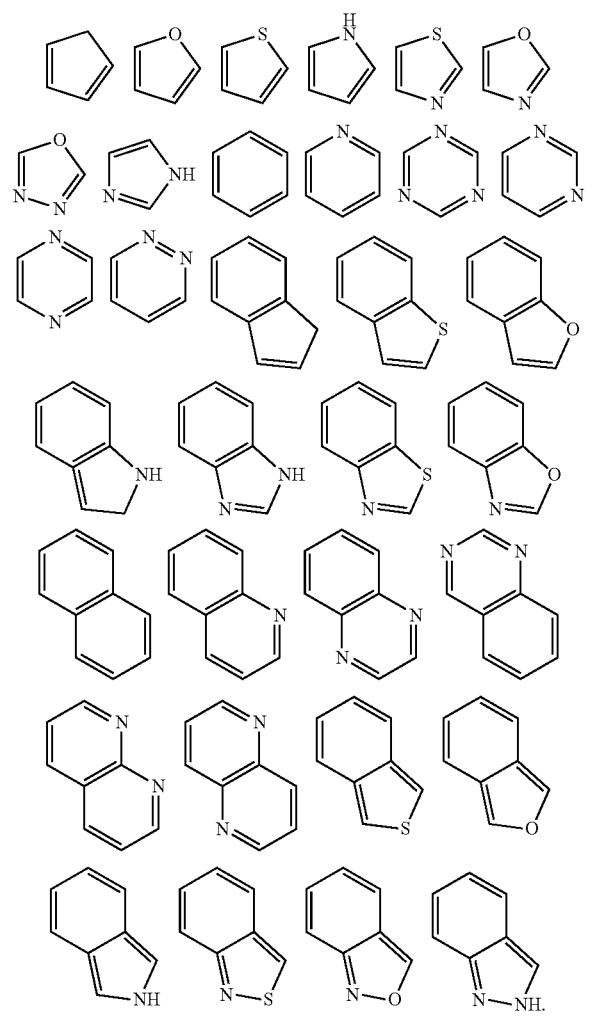

In other embodiments, $Ar^3$ in the general formula (I) may be selected from the following structural units, and it may be further substituted:

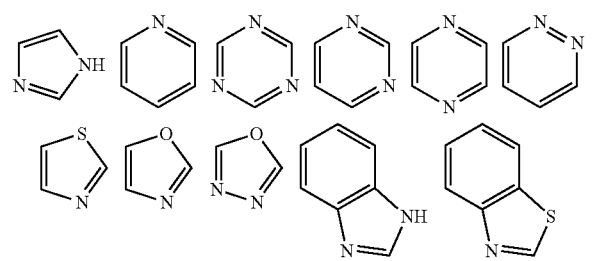

-continued

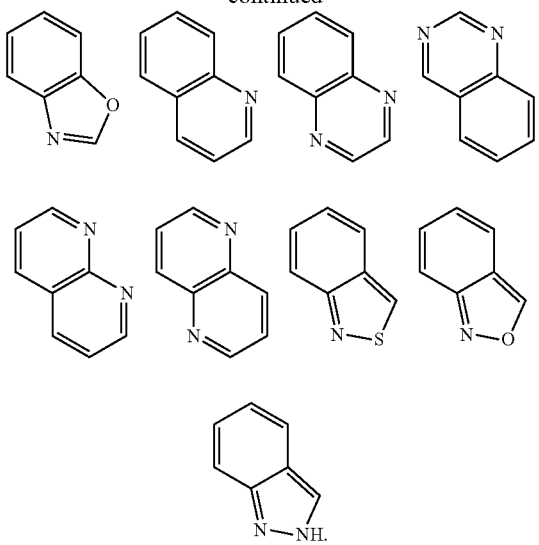

In one embodiment, the organometallic complex according to the present disclosure has the following general formulas:

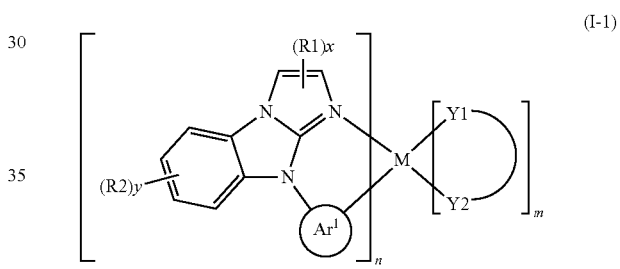
(I-1)

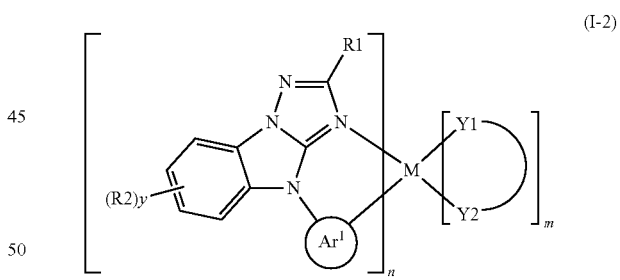
(I-2)

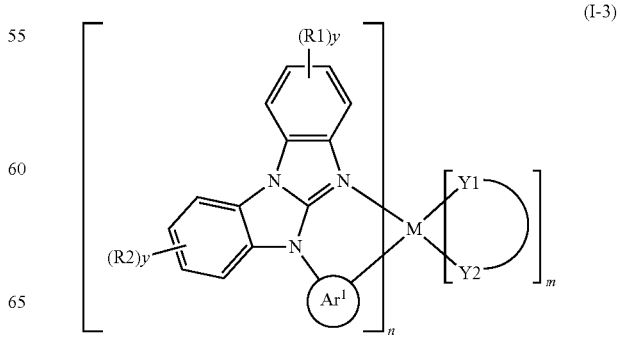
(I-3)

-continued

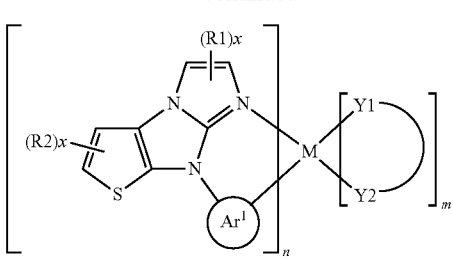
(I-4)

wherein x is any integer from 0 to 2, y is any integer from 0 to 4, and wherein $R^1$ and $R^2$ are each independently selected from any one of the group consisting of: H; F; Cl; Br; I; D; CN; $NO_2$; $CF_3$; $B(OR^2)_2$; $Si(R^2)_3$; linear alkane; alkane ether; alkane thioether containing 1 to 10 carbon atoms; branched alkane; cycloalkane; and aryl containing 6 to 10 carbon atoms.

In some embodiments, $Ar^1$ in the general formulas (I), (I-1), (I-2), (I-3) and (I-4) is an aromatic or heteroaromatic ring unit, which is in multiple occurrence independently selected from the general formulas C1-C5, wherein $R^3$ to $R^{19}$ are selected from the group consisting of: H; F; Cl; Br; I; D; CN; $NO_2$; $CF_3$; $B(OR^2)_2$; $Si(R^2)_3$; linear alkane; alkane ether; alkane thioether containing 1 to 10 carbon atoms; branched alkane; cycloalkane; and aryl containing 6 to 10 carbon atoms, wherein the dashed lines indicate that connection is carried out in the form of a single bond,

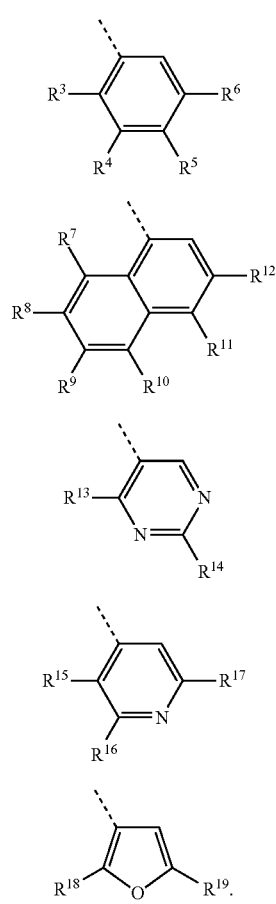

C1

C2

C3

C4

C5

According to the organometallic complex of the present disclosure, the metal element M is a transition metal element.

In one embodiment, the metal element M may be selected from the group consisting of: chromium (Cr), molybdenum (Mo), tungsten (W), ruthenium (Ru), rhodium (Rh), nickel (Ni), argentum (Ag), copper (Cu), zinc (Zn), palladium (Pd), gold (Au), osmium (Os), rhenium (Re), iridium (Ir), and platinum (Pt). In a particular embodiment, the metal element M may be selected from Ir or Pt.

In terms of the heavy atom effect, Ir or Pt is preferably used as a central metal M of the abovementioned organometallic complex. Iridium is particularly a good choice because iridium has stable chemical properties and pronounced heavy atom effect, thereby resulting in higher luminous efficiency.

Specific non-limiting examples of suitable organometallic complexes according to the present disclosure are given below:

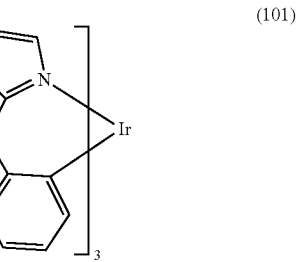
(101)

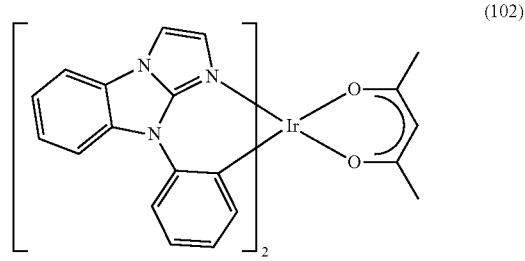
(102)

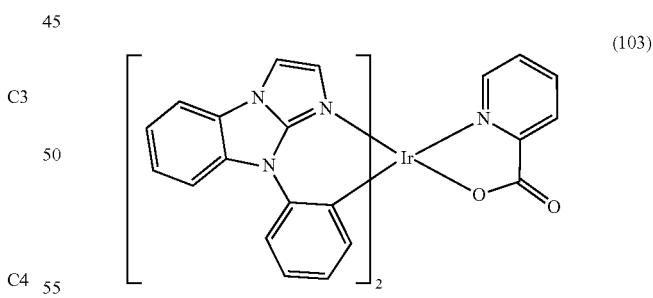
(103)

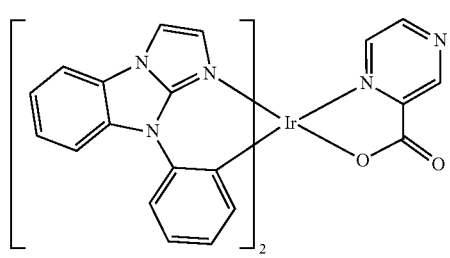
(104)

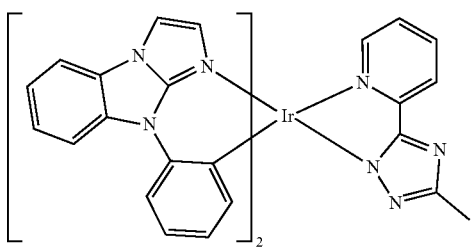
(105)
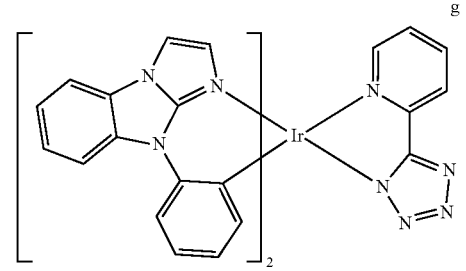
(106)
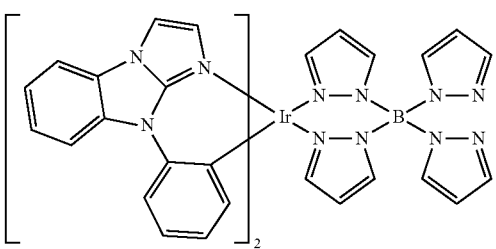
(107)
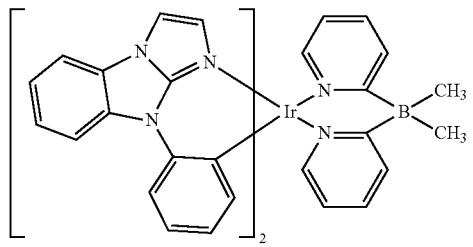
(108)
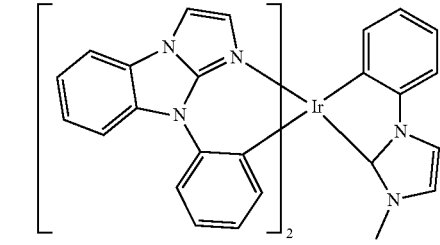
(109)
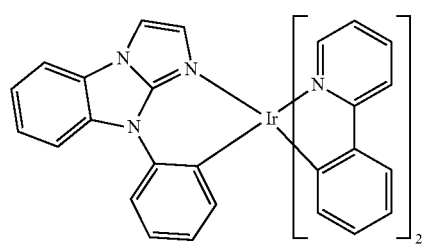
(110)
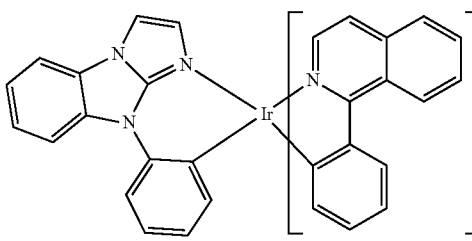
(111)
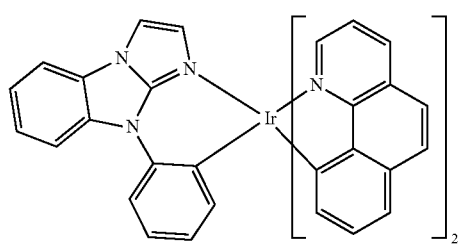
(112)
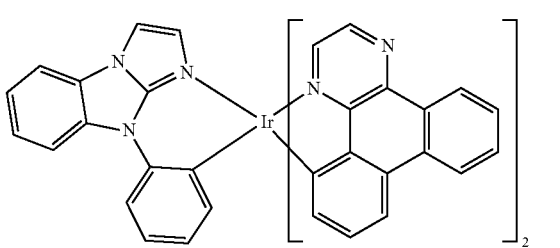
(113)
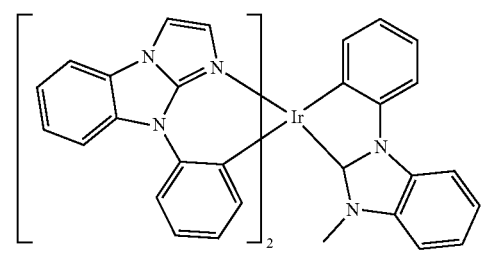
(114)
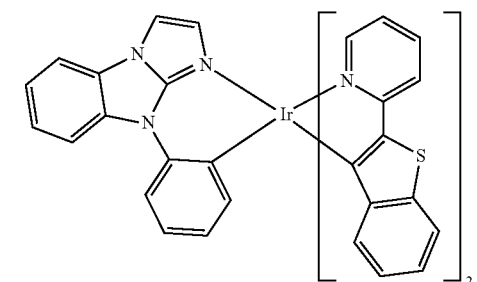
(115)
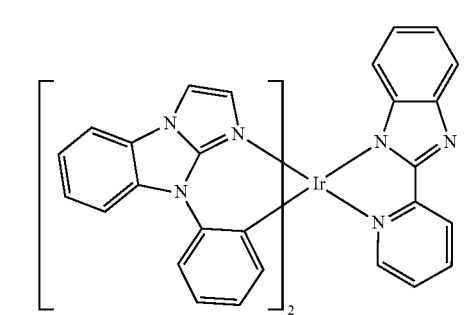
(116)

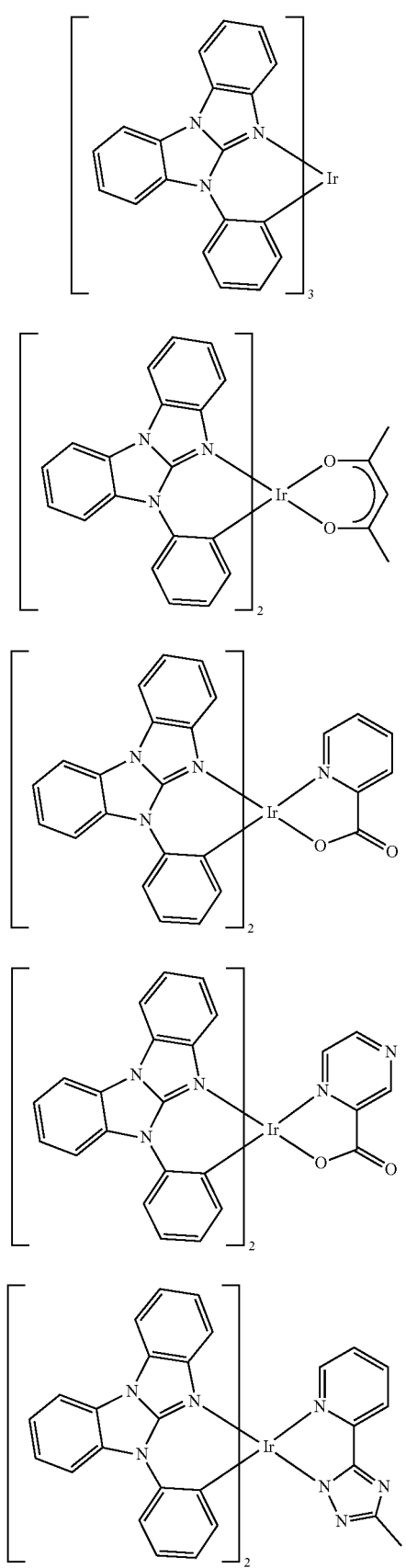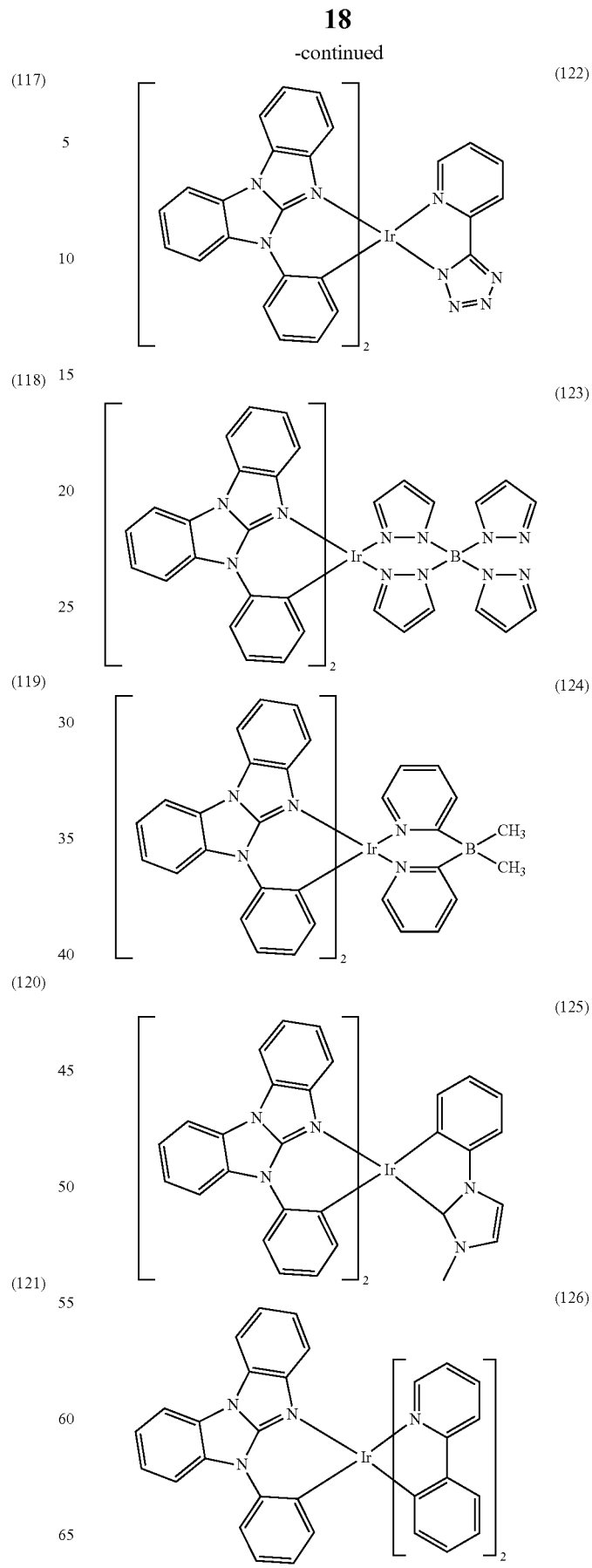

-continued
(127)
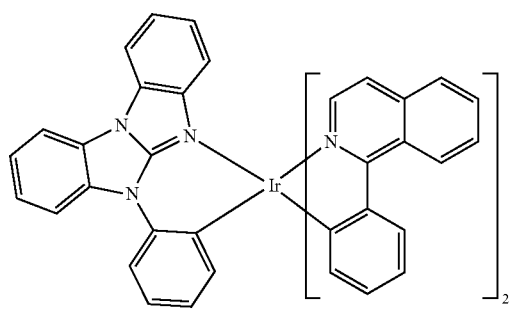
(128)
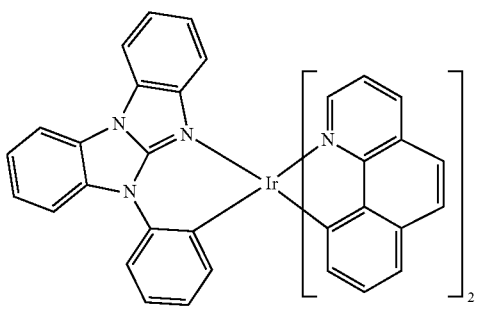
(129)
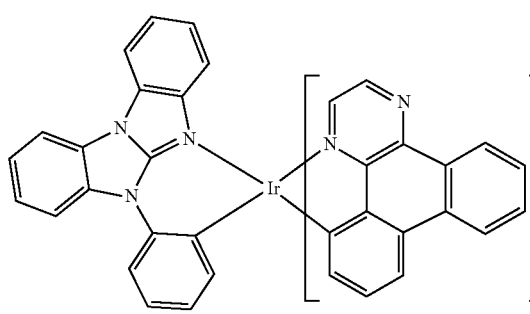
(130)
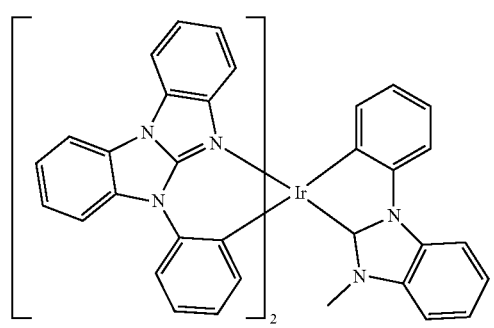
-continued
(131)
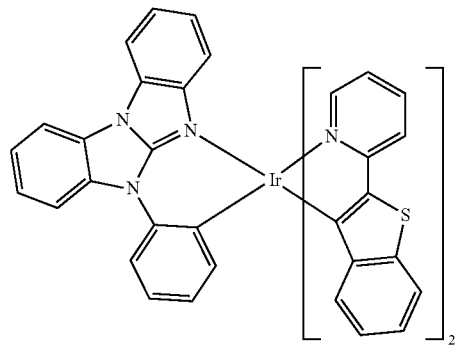
(132)
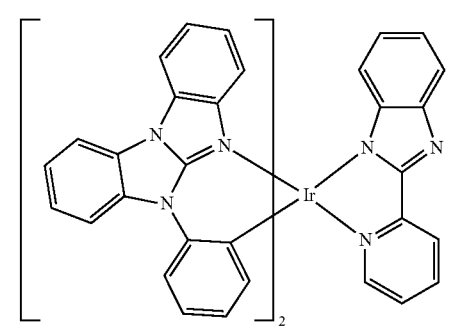
(133)
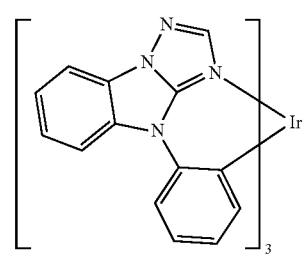
(134)
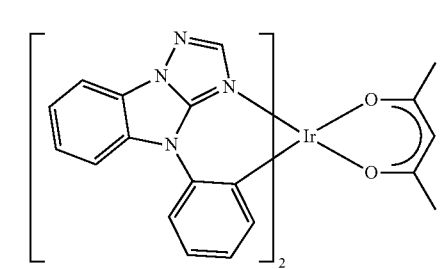
(135)
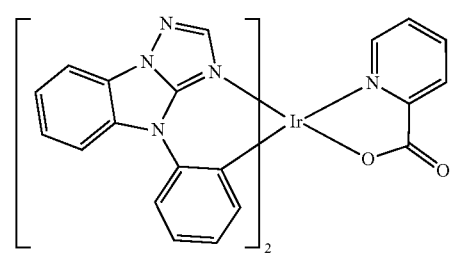

-continued
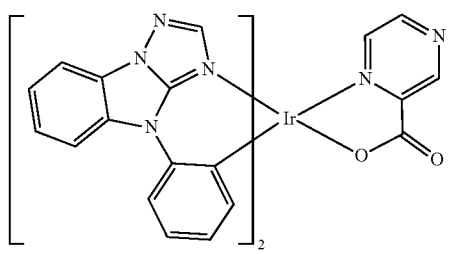
(136)
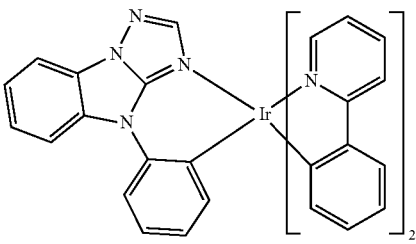
(142)
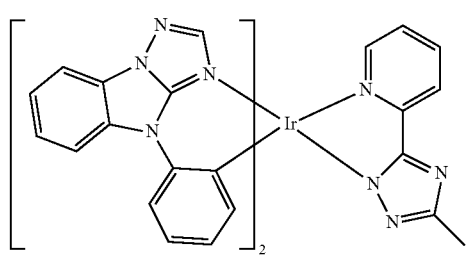
(137)
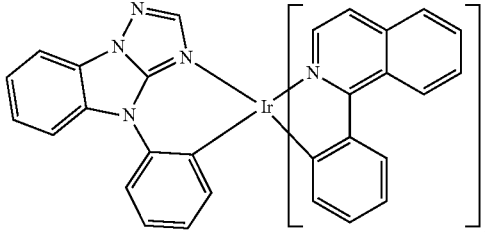
(143)
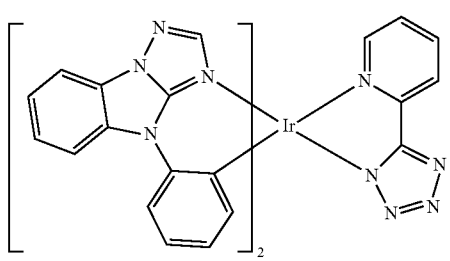
(138)
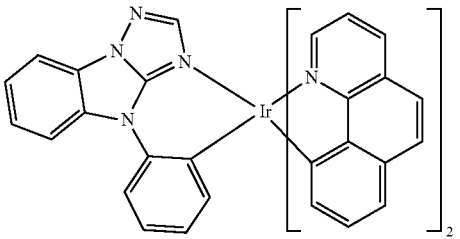
(144)
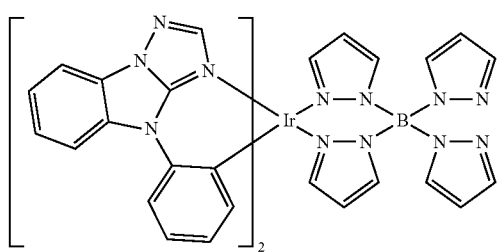
(139)
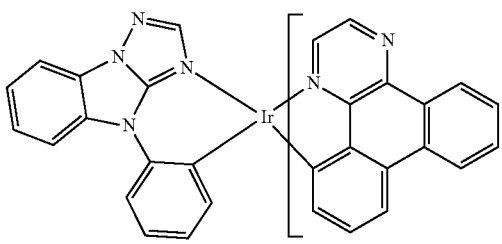
(145)
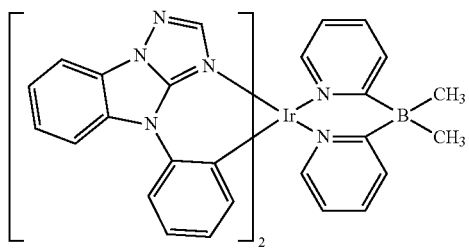
(140)
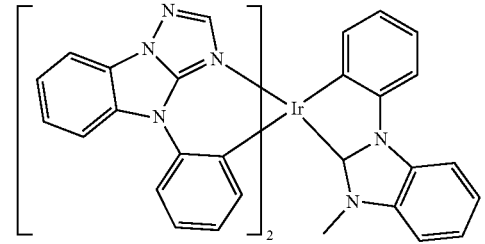
(146)
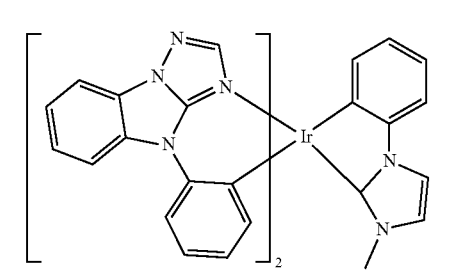
(141)
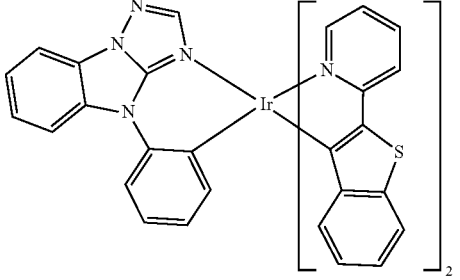
(147)

(148)
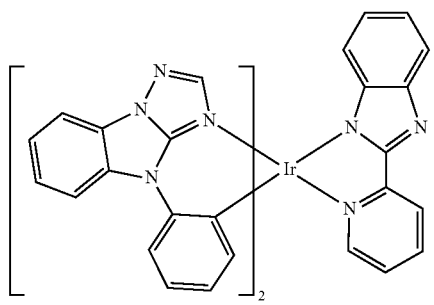
(149)
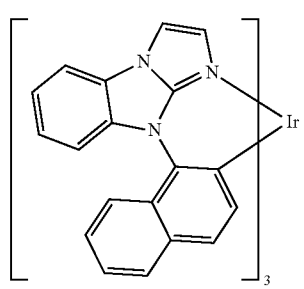
(150)
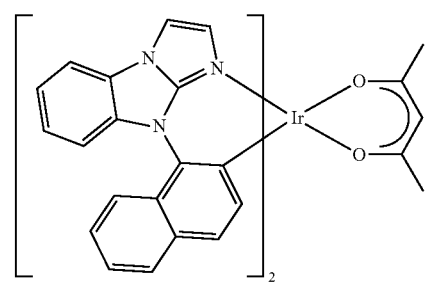
(151)
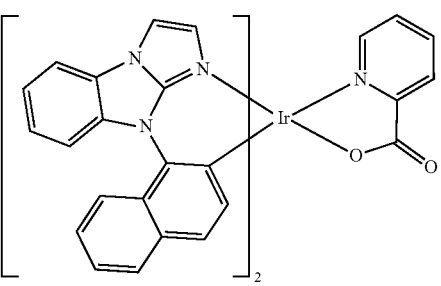
(152)
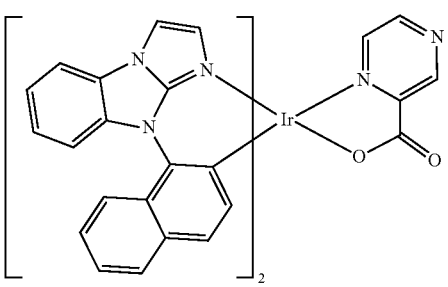
(153)
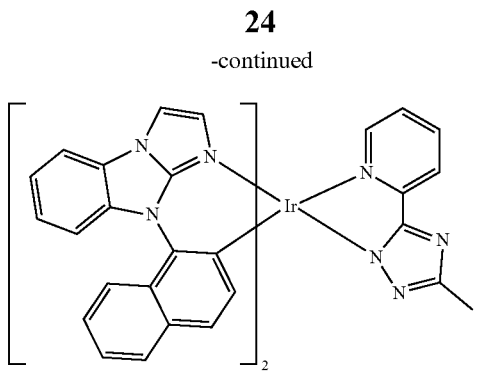
(154)
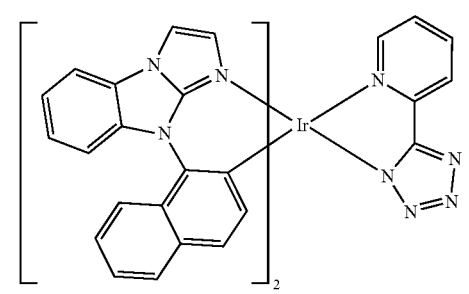
(155)
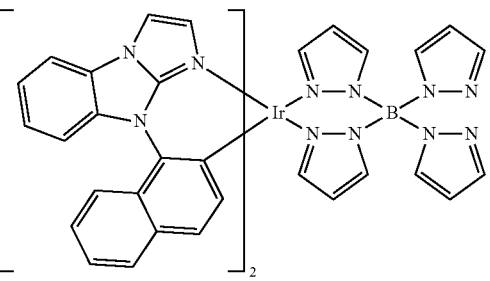
(156)
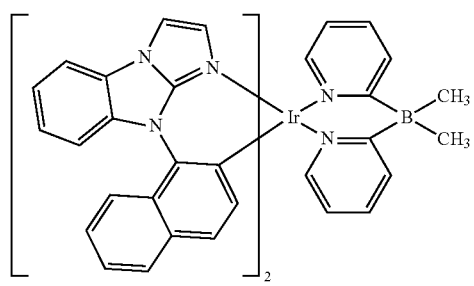
(157)
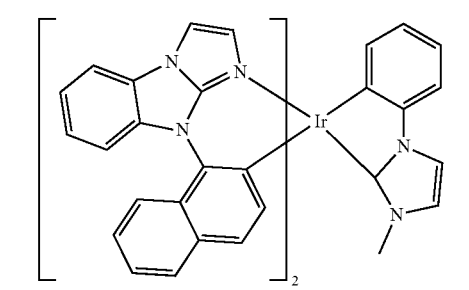

(158)
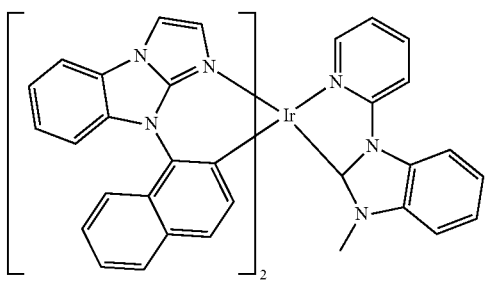
(159)
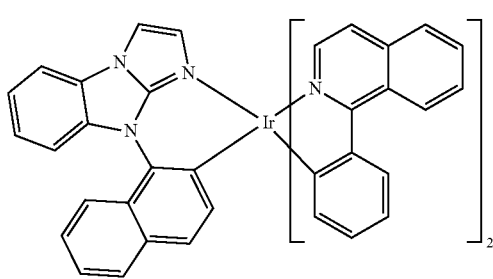
(160)
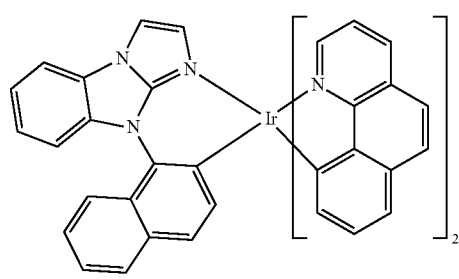
(161)
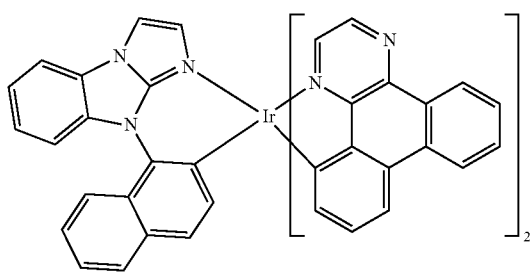
(162)
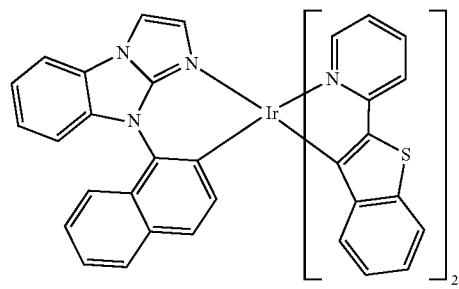
(163)
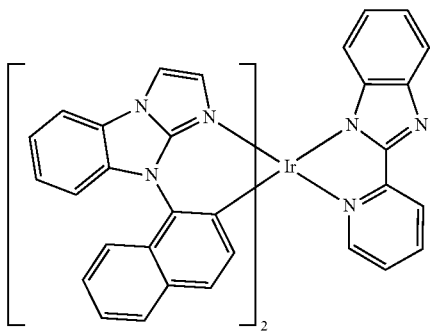
(164)
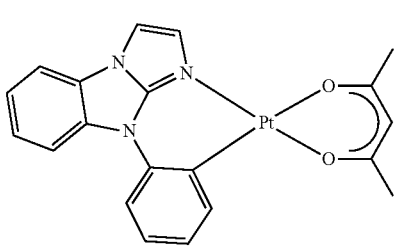
(165)
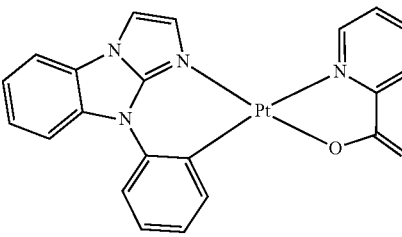
(166)
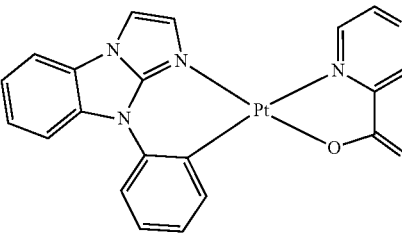
(167)
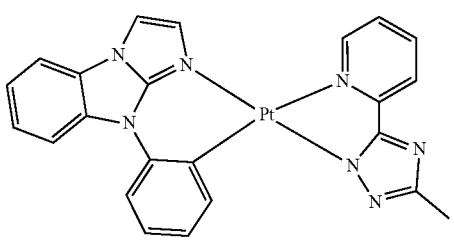
(168)
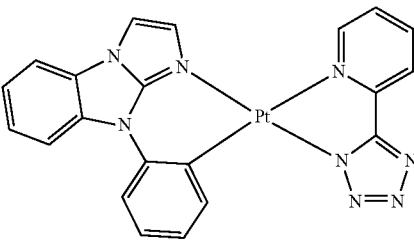

-continued
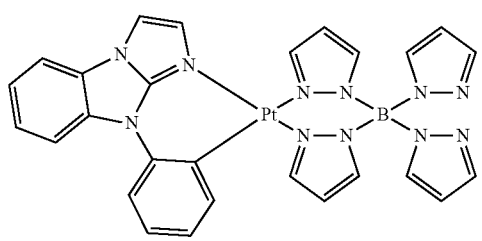
(169)
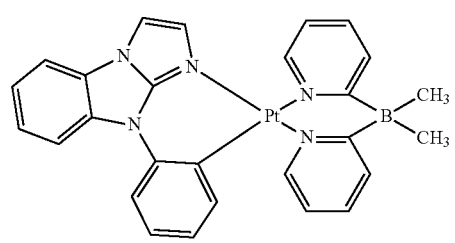
(170)
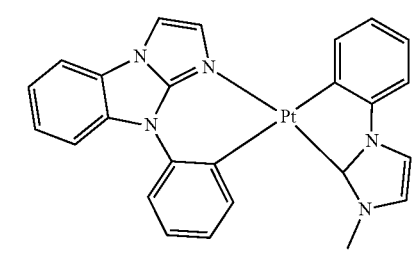
(171)
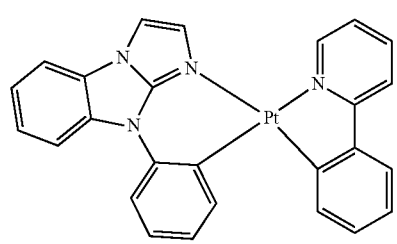
(172)
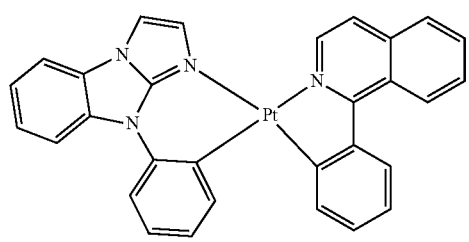
(173)
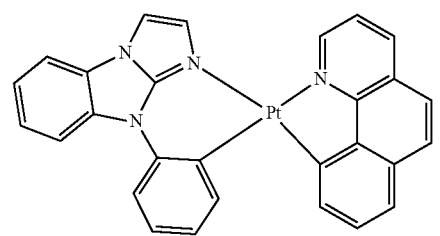
(174)
-continued
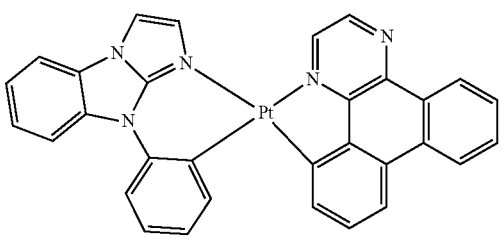
(175)
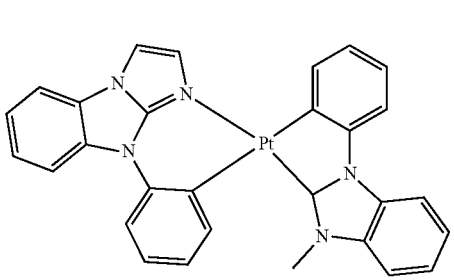
(176)
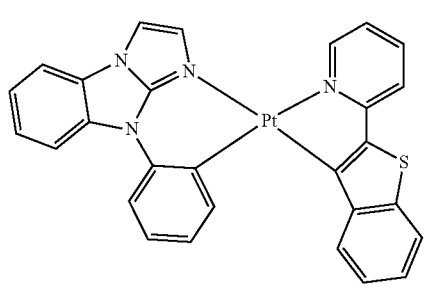
(177)
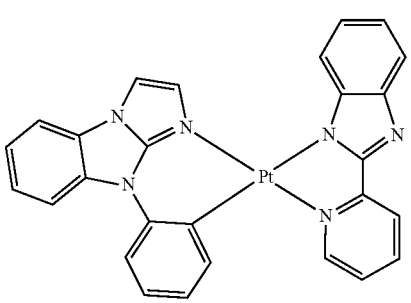
(178)
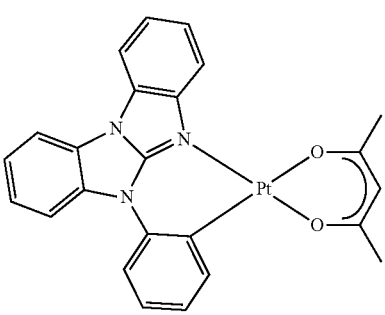
(179)

(180)
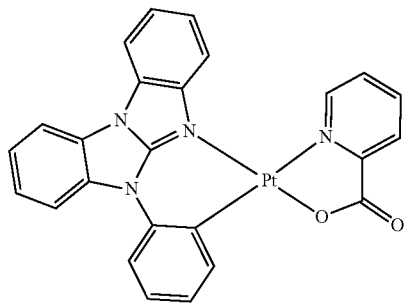
(181)
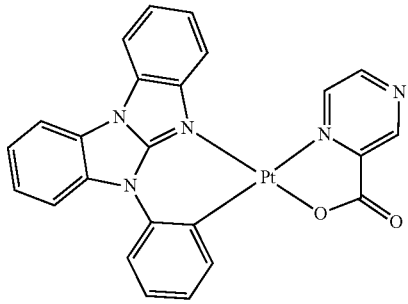
(182)
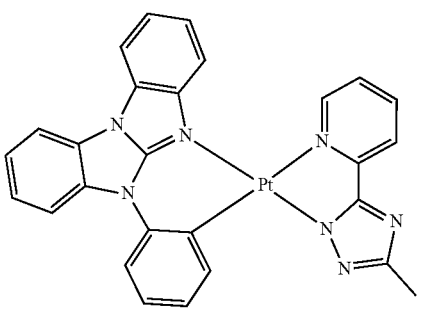
(183)
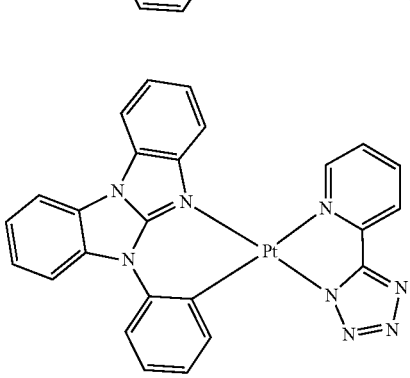
(184)
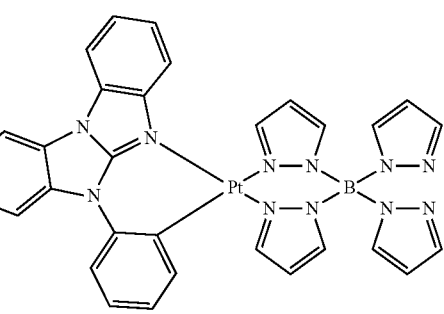
(185)
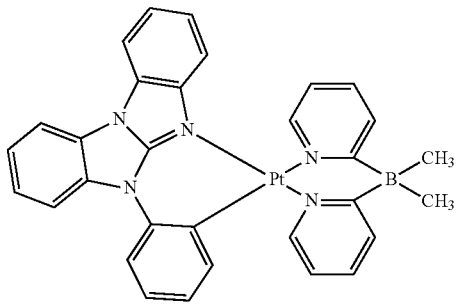
(186)
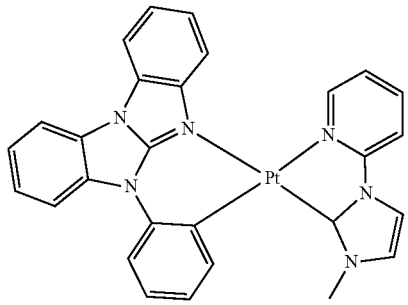
(187)
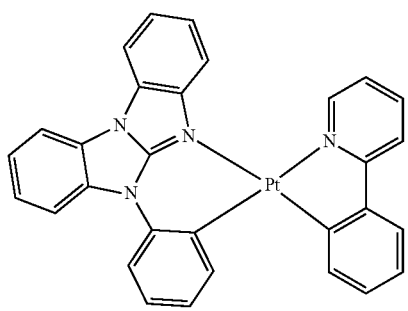
(188)
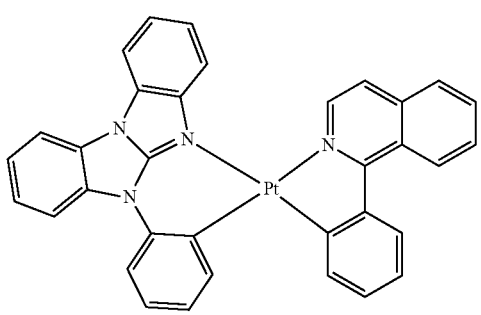
(189)
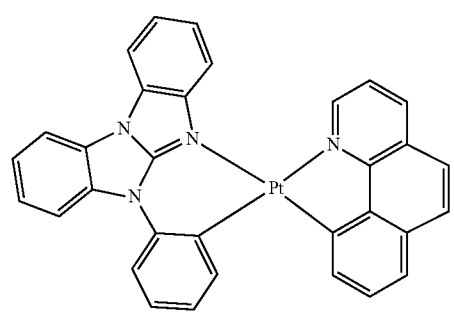

(190)

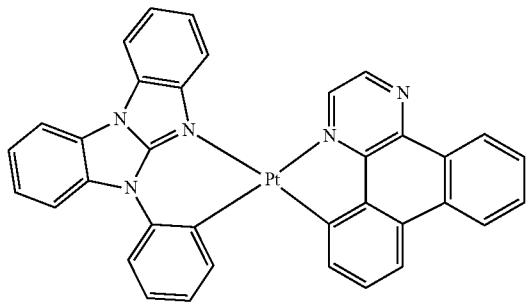

(191)

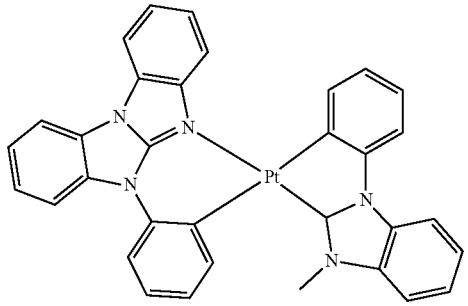

(192)

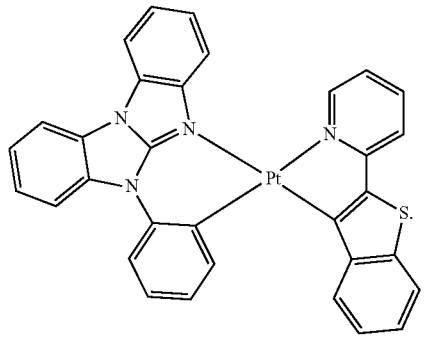

In a particular embodiment, the organometallic complex according to the present disclosure is a light-emitting material, whose light emission wavelength is between 300 and 1000 nm. In another embodiment, the light emission wavelength of the light-emitting material is between 350 and 900 nm. In another embodiment, the light emission wavelength of the light-emitting material is between 400 and 800 nm. Light emission herein refers to photoluminescence or electroluminescence. In some embodiments, the organometallic complex according to the present disclosure has a photoluminescent efficiency of ≥30%, ≥40% in one embodiment, ≥50% in another embodiment, and ≥60% in a particularly embodiment.

In some embodiments, the organometallic complex according to the present disclosure may either not be a light-emitting material.

Another aspect of the present disclosure also relates to a polymer in which a repeating unit comprises the structural features of the organometallic complex according to the present disclosure. In some embodiments, the polymer is a non-conjugated polymer, wherein the structural unit represented by the general formula (I) is on side chain. In another embodiment, the polymer is a conjugated polymer.

Another aspect of the disclosure also relates to a mixture comprising an organometallic complex or polymer according to the disclosure, and at least one organic functional material.

The organic functional material herein includes a hole (also called electron hole) injection or transport material (HIM/HTM), a hole-blocking material (HBM), an electron-injection or electron-transport material (EIM/ETM), an electron-blocking material (EBM), an organic host material (Host), a singlet emitter (a fluorescent emitter), a thermally activated delayed fluorescent emitter (TADF), a triplet emitter (a phosphorescent emitter), in particular a light-emitting organometallic complex, and an organic dye. For example, various organic functional materials are described in detail in patent documents WO2010135519A1, US20090134784A1 and WO2011110277A1, which are hereby incorporated by reference in their entireties.

In the present disclosure, a host material and a matrix material have the same meaning and they are interchangeable.

The organic functional material can be a small molecule or polymeric material.

The term "small molecule" as defined herein refers to a molecule that is not a polymer, an oligomer, a dendritic polymer, or a blend. In particular, there are no repeating structures in a small molecule. The molecular weight of the small molecule is ≤3000 g/mol, ≤2000 g/mol in another embodiment, and ≤1500 g/mol in another embodiment.

A polymer includes a homopolymer, a copolymer, and a block copolymer. In addition, in the present disclosure, the polymer also includes a dendrimer. As to synthesis and application of dendrimers, reference can be made to Dendrimers and Dendrons, Wiley-VCH Verlag GmbH & Co. KGaA, 2002, Ed. George R. Newkome, Charles N. Moorefield, Fritz Vogtle.

A conjugated polymer is a polymer whose backbone is predominantly composed of $sp^2$ hybrid orbital of carbon atoms. Typical examples include, but are not limited to, polyacetylene and poly(phenylene vinylene), on the backbone of which the carbon atoms can also be substituted by other non-carbon atoms, and which are still considered as conjugated polymers when the hybridization of $sp^2$ on the backbone is interrupted by some natural defects. Moreover, the conjugated polymer in the present disclosure also includes arylamine, aryl phosphine and other heterocyclic aromatic hydrocarbons, organometallic complexes and the like on the backbone.

In some embodiments, the content of the organometallic complex in the mixture according to the present disclosure is 0.01 to 30 wt %, 0.1 to 20 wt % in another embodiment, 0.2 to 15 wt % in another embodiment, and 2 to 15 wt % in a particularity embodiment.

In one embodiment, the mixture according to the disclosure comprises the organometallic complex or polymer according to the present disclosure, and a triplet host material.

In another embodiment, the mixture according to the present disclosure comprises the organometallic complex or polymer according to the present disclosure, a triplet host material and a triplet emitter.

In another embodiment, the mixture according to the present disclosure comprises an organometallic complex or polymer according to the present disclosure, and a thermally activated delayed fluorescent material (TADF).

More detailed and non-limiting description of the triplet host material, the triplet emitter, and the TADF material is made hereafter.

1. Triplet Host Materials:

Examples of triplet host materials are not particularly limited, and any metal complexes or organic compounds may be used as hosts, as long as the triplet energy thereof is higher than that of emitters, particularly triplet emitters or phosphorescent emitters.

Examples of metal complexes that can be used as triplet hosts include, but are not limited to, the following general structure:

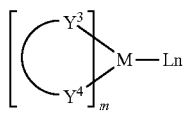

M is a metal; ($Y^3$—$Y^4$) is a bidentate ligand, $Y^3$ and $Y^4$ are independently selected from the group consisting of C, N, O, P, and S; L is an auxiliary ligand; m is an integer whose value is between 1 and a maximum coordination number of the metal; and m+n is the maximum coordination number of the metal.

In one embodiment, the metal complex that can be used as a triplet host has the following forms:

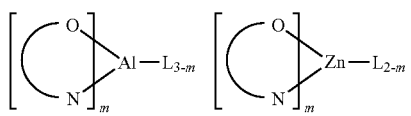

(O—N) is a bidentate ligand in which the metal is coordinated with O and N atoms.

In a certain embodiment, M may be selected from Ir and Pt.

Examples of organic compounds that may be used as triplet host are selected from the group consisting of: compounds containing cyclic aromatic hydrocarbon groups such as, but not limited to benzene, biphenyl, triphenyl, benzo, and fluorene; compounds containing aromatic heterocyclic groups, such as triphenylamine, dibenzothiophene, dibenzofuran, dibenzoselenophen, furan, thiophene, benzofuran, benzothiophene, benzoselenophene, carbazole, indolocarbazole, indolopyridine, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazin, oxadiazine, indole, benzimidazole, indoxazine, bisbenzoxazole, isoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, or a combination thereof; groups containing 2 to 10 membered ring structures which may be the same or different types of cyclic aromatic groups or aromatic heterocyclic groups and are bonded to each other directly or through at least one of the following groups, for example: oxygen atom, nitrogen atom, sulfur atom, silicon atom, phosphorus atom, boron atom, chain structure unit, and aliphatic cyclic group; and wherein each Ar may be further optionally substituted, and the substituents may be selected from the group consisting of hydrogen, alkyl, alkoxy, amino, alkene, alkyne, aralkyl, heteroalkyl, aryl and heteroaryl.

In one embodiment, the triplet host material may be selected from compounds comprising at least one of the following groups:

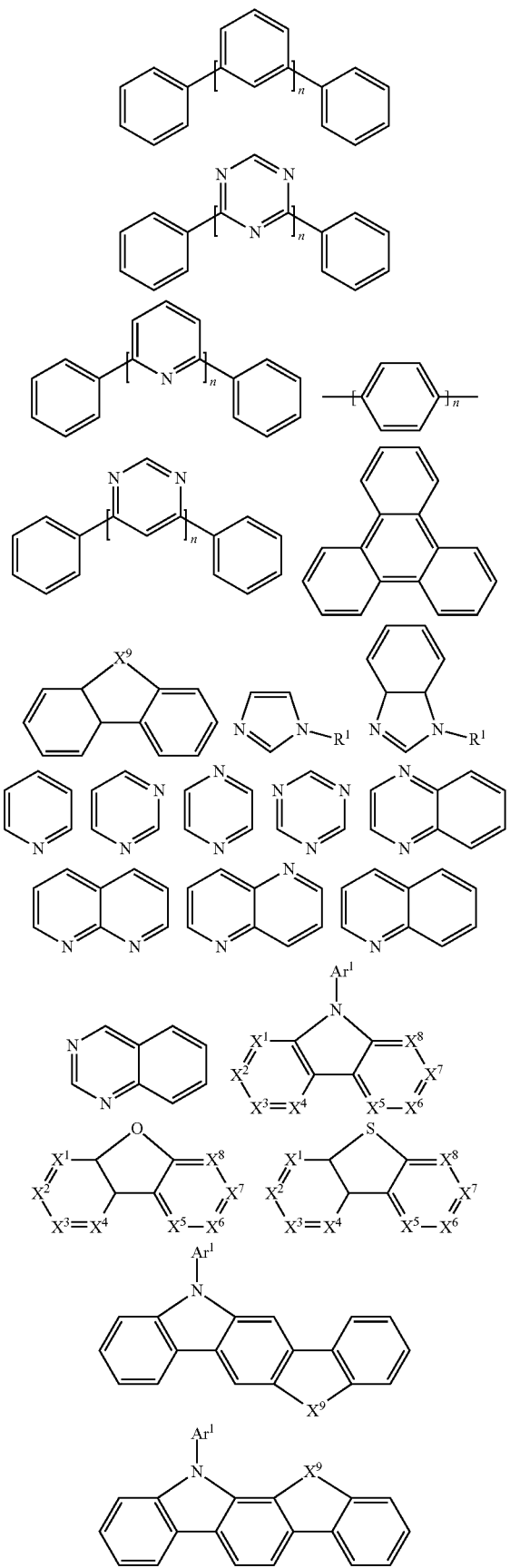

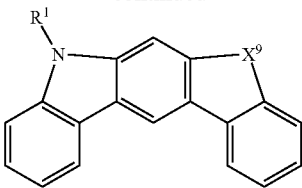

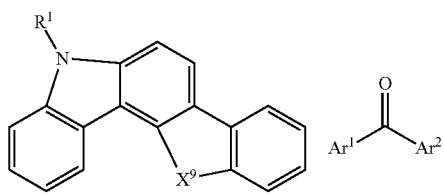

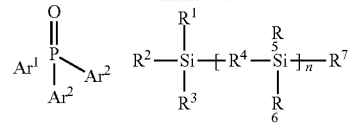

R¹ to R⁷ may be independently selected from the group consisting of hydrogen, alkyl, alkoxy, amino, alkene, alkyne, aralkyl, heteroalkyl, aryl, and heteroaryl, and when R¹ to R⁷ are aryl or heteroaryl, they have the same meaning as Ar¹ and Ar² described above; n is any integer from 0 to 20; $X^1$ to $X^8$ are selected from CH or N; $X^9$ is selected from $CR^1R^2$ or $NR^1$. R¹ and R² have the same definitions as R¹ in the moiety of ETM.

Non-limiting examples of suitable triplet host materials are listed in the following table:

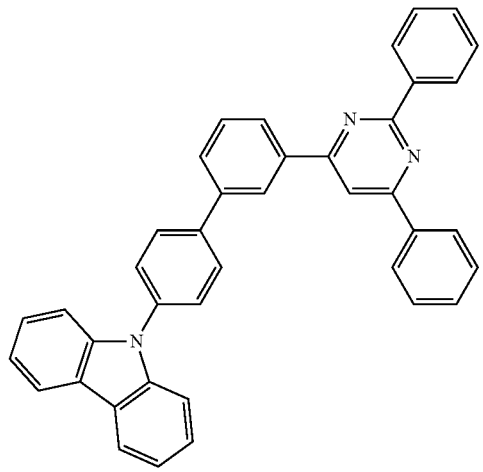 [SMILES: c1ccc(-c2cc(-c3cccc(-c4ccc(-n5c6ccccc6c6ccccc65)cc4)c3)nc(-c3ccccc3)n2)cc1]

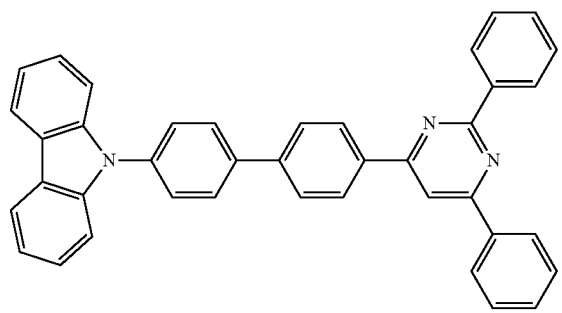 [SMILES: c1ccc(-c2cc(-c3ccc(-c4ccc(-n5c6ccccc6c6ccccc65)cc4)cc3)nc(-c3ccccc3)n2)cc1]

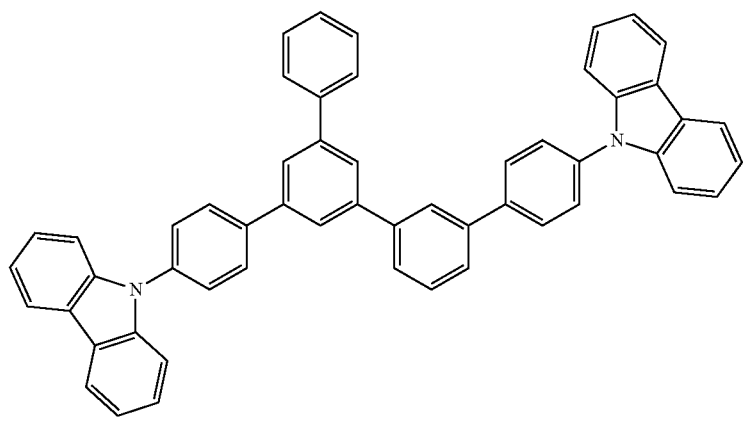 [SMILES: c1ccc(-c2cc(-c3ccc(-n4c5ccccc5c5ccccc54)cc3)cc(-c3cccc(-c4ccc(-n5c6ccccc6c6ccccc65)cc4)c3)c2)cc1]

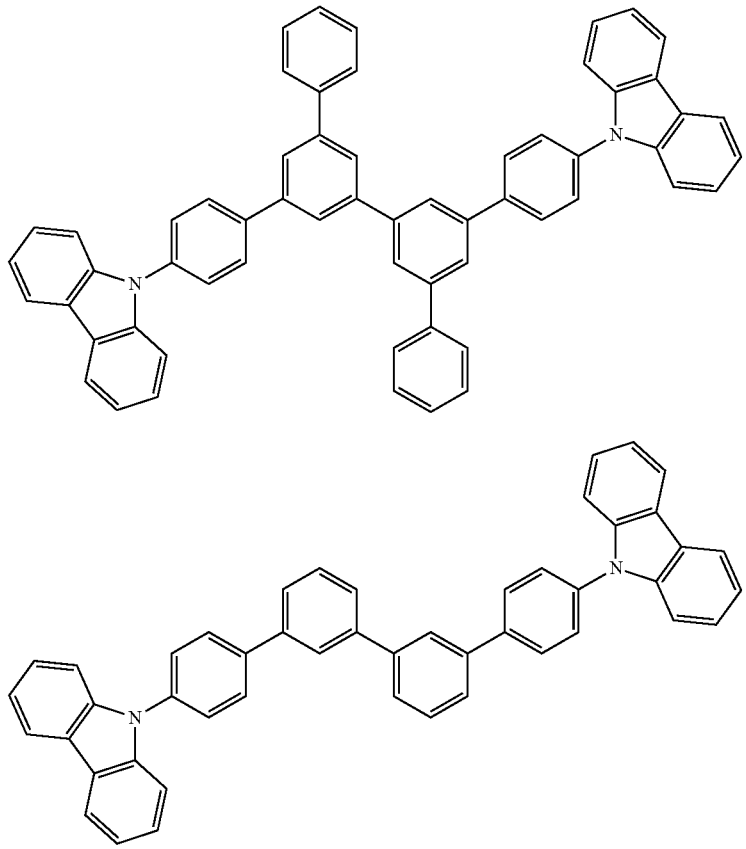

2. Triplet Emitter

A triplet emitter is also called a phosphorescent emitter. In one embodiment, the triplet emitter is a metal complex having the general formula M(L)n, wherein M is a metal atom, and L may be the same or different organic ligand in each occurrence, and may be bonded or coordinated to the metal atom M at one or more positions; n is an integer greater than 1, for example 1, 2, 3, 4, 5, or 6. Optionally, these metal complexes are attached to a polymer by one or more positions, for example through organic ligands.

In some embodiments, the metal atom M may be selected from the group consisting of transition metal elements, lanthanides and actinides, such as Ir, Pt, Pd, Au, Rh, Ru, Os, Sm, Eu, Gd, Tb, Dy, Re, Cu, or Ag, and particularly selected from Os, Ir, Ru, Rh, Re, Pd, or Pt.

In one embodiment, the triplet emitter may contain a chelating ligand, i.e., a ligand, coordinated to the metal by at least two bonding sites. In another embodiment, the triplet emitter contains two or three identical or different bidentate or multidentate ligands. Chelating ligands help to improve the stability of metal complexes.

Non-limiting examples of organic ligands may be selected from the group consisting of phenylpyridine derivatives, 7,8-benzoquinoline derivatives, 2 (2-thienyl) pyridine derivatives, 2 (1-naphthyl) pyridine derivatives, or 2 phenylquinoline derivatives. All of these organic ligands may be optionally substituted, for example, optionally substituted with fluoromethyl or trifluoromethyl. The auxiliary ligand may be preferably selected from acetylacetonate or picric acid.

In one embodiment, the metal complex that may be used as a triplet emitter may have the following form:

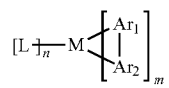

wherein M is a metal selected from the group consisting of transition metal elements, lanthanides and actinides;

m is 1, 2 or 3, in an embodiment, m is 2 or 3, and in another embodiment, m is 3; n is 0, 1, or 2, in an embodiment, n is 0 or 1, and in another embodiment, n is 0; when m≥1, each $Ar_1$ may be the same or different cyclic group, which comprises at least one donor atom, that is, an atom with a lone pair of electrons, such as nitrogen or phosphorus, and is coordinated to the metal through its cyclic group; and each $Ar_2$ may be the same or different cyclic group comprising at least one C atom and is coordinated to the metal through its cyclic group; $Ar_1$ and $Ar_2$ are covalently bonded together, wherein each of them may carry one or more substituents, and they may further be bonded together by substituents; when n≥1, each L may be the same or different auxiliary ligand for example a bidentate chelating ligand, and especially a monoanionic bidentate chelating ligand.

Non-limiting examples of some triplet emitter materials and applications may be found in the following patent documents and references: WO 200070655, WO 200141512, WO 200202714, WO 200215645, EP 1191613, EP 1191612, EP 1191614, WO 2005033244, WO 2005019373, US 2005/0258742, WO 2009146770, WO 2010015307, WO 2010031485, WO 2010054731, WO 2010054728, WO 2010086089, WO 2010099852, WO 2010102709, US 20070087219 A1, US 20090061681 A1, US 20010053462 A1, Baldo, Thompson et al. Nature 403, (2000), 750-753, US 20090061681 A1, US 20090061681 A1, Adachi et al. Appl. Phys. Lett. 78 (2001), 1622-1624, J. Kido et al. Appl. Phys. Lett. 65 (1994), 2124, Kido et al. Chem. Lett. 657, 1990, US 2007/0252517 A1, Johnson et al., JACS 105, 1983, 1795, Wrighton, JACS 96, 1974, 998, Ma et al., Synth. Metals 94, 1998, 245, U.S. Pat. Nos. 6,824,895, 7,029,766, 6,835,469, 6,830,828, US 20010053462 A1, WO 2007095118 A1, US 2012004407A1, WO 2012007088A1, WO2012007087A1, WO 2012007086A1, US 2008027220A1, WO 2011157339A1, CN 102282150A, and WO 2009118087A1. All the contents of the above patent documents and references are hereby incorporated by reference.

Non-limitting examples of some suitable triplet emitters are listed in the table below:

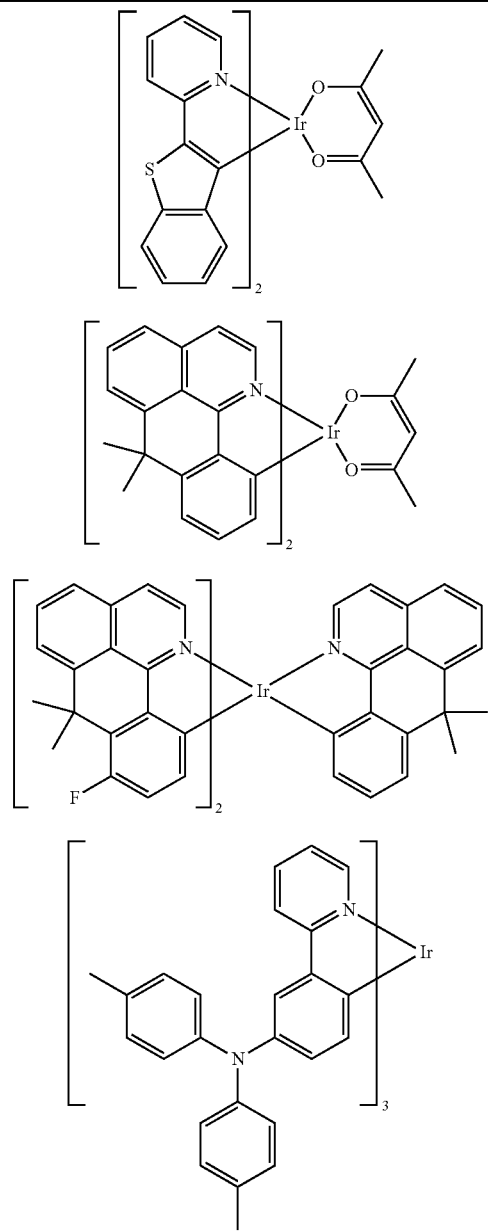

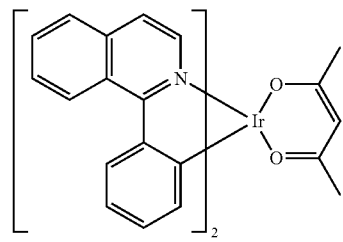

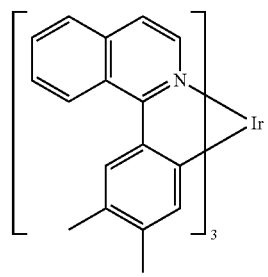

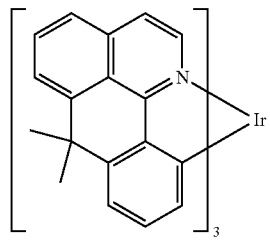

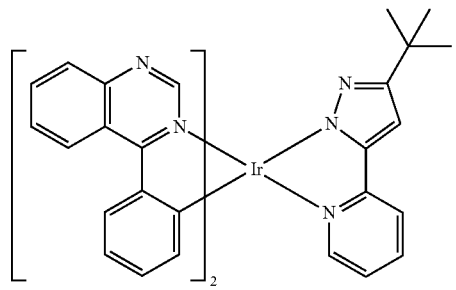

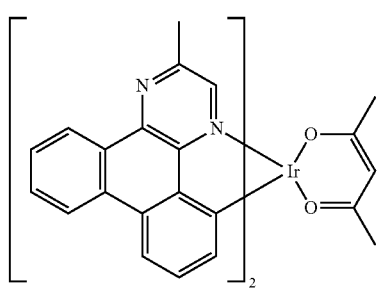

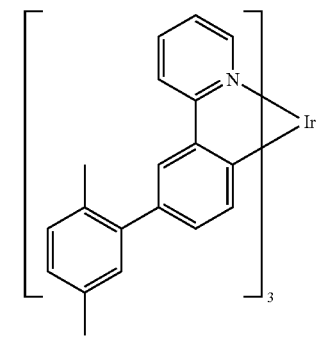
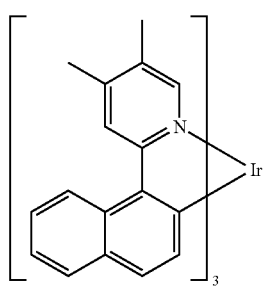
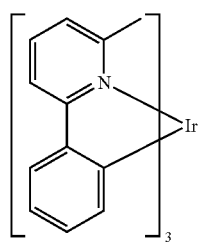
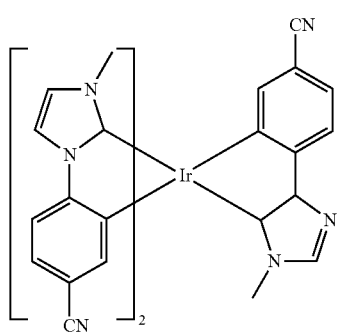
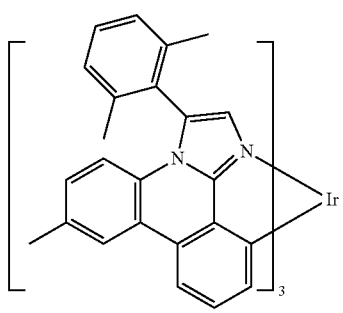
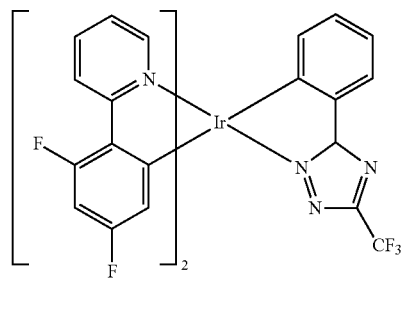
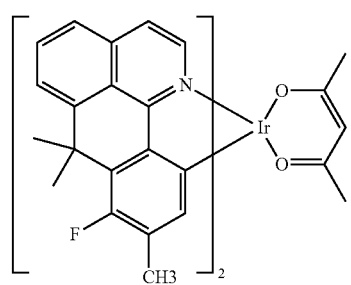
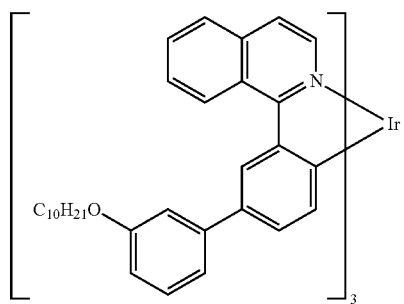
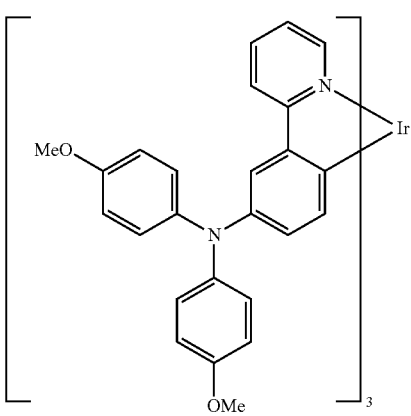

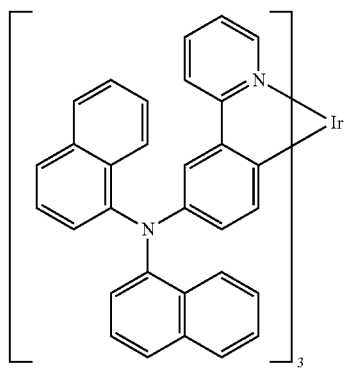
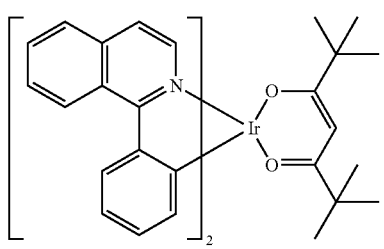
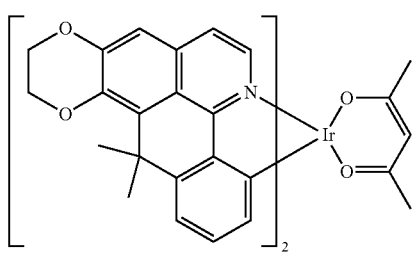
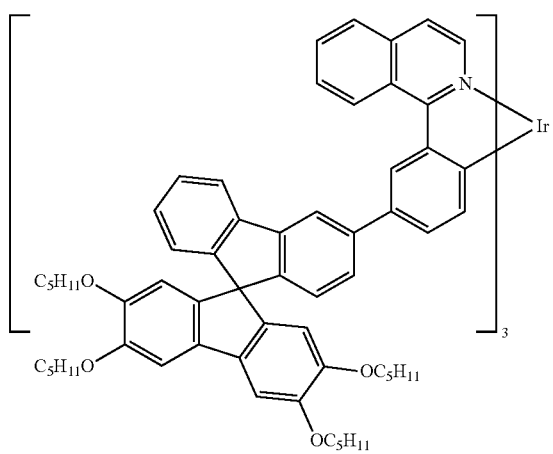
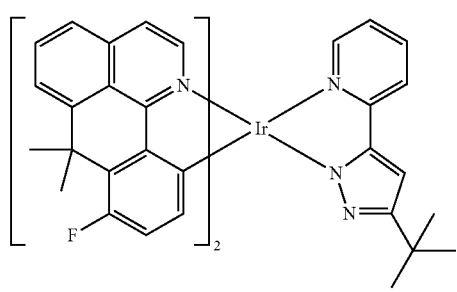
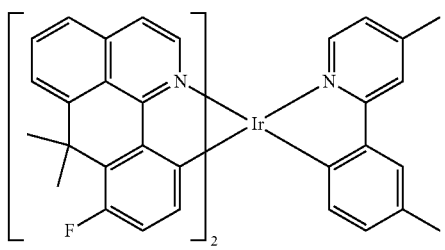
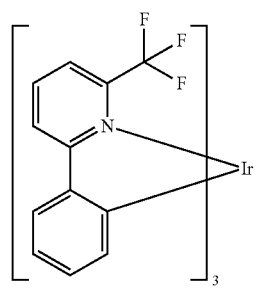
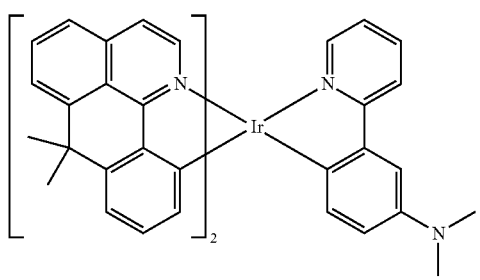
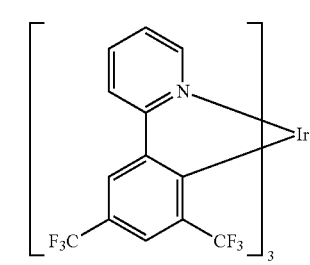
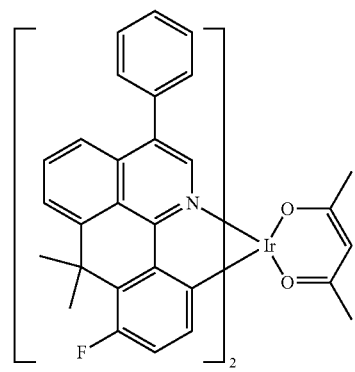

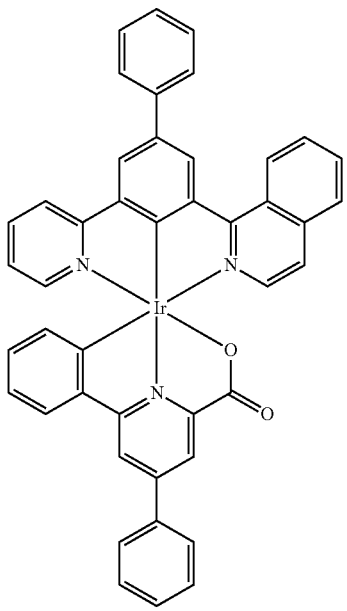
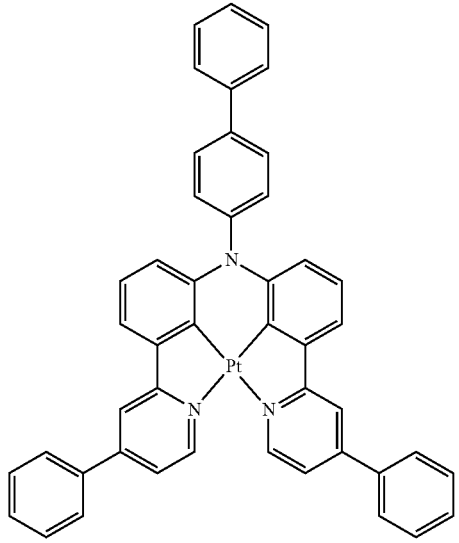
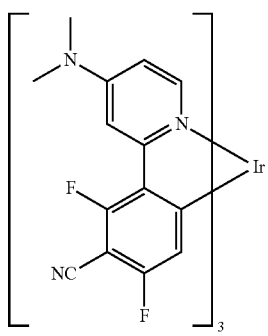
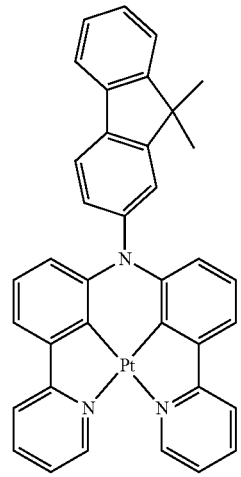
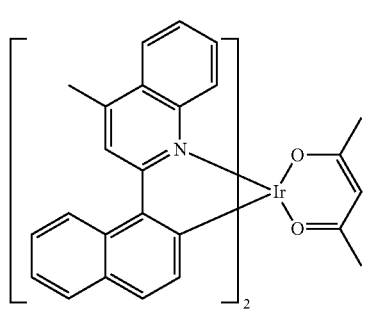
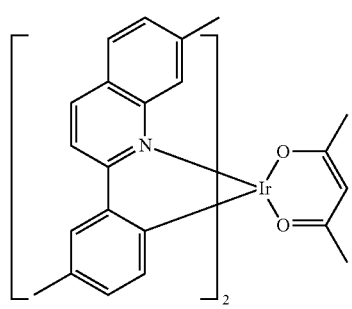

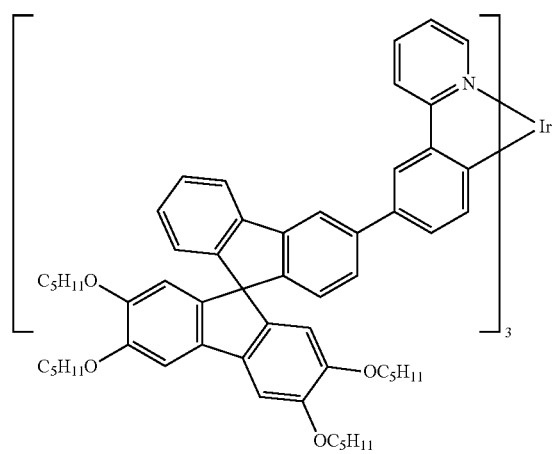
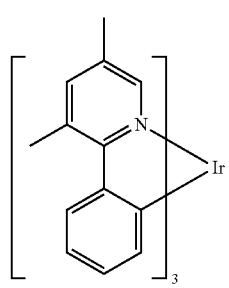
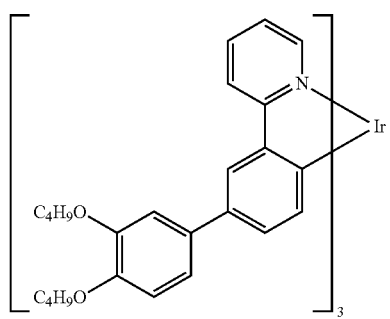
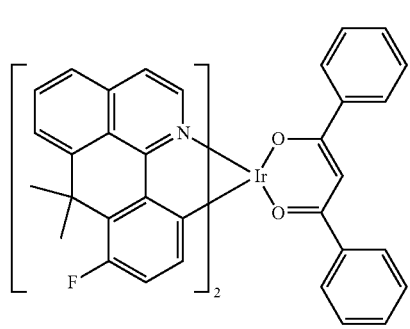
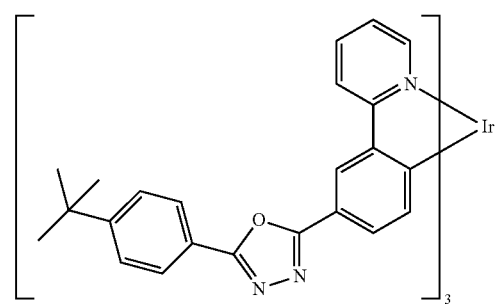
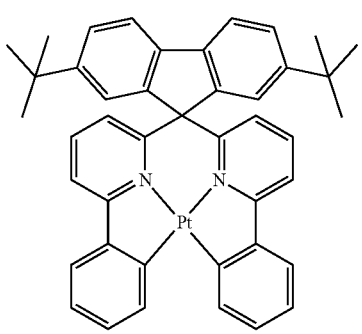
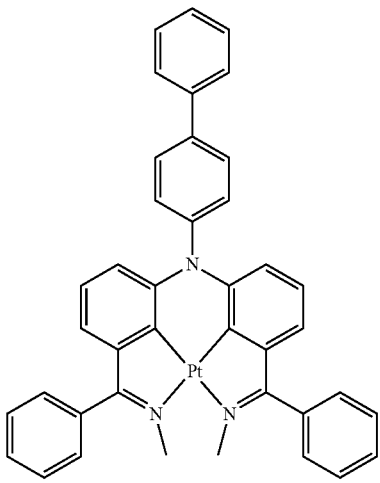
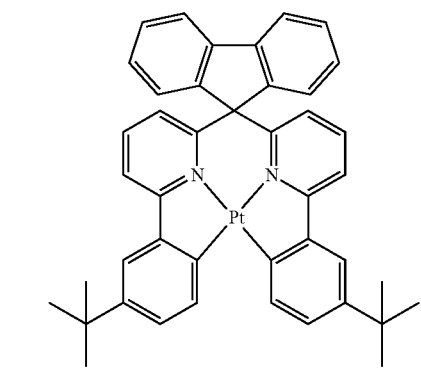

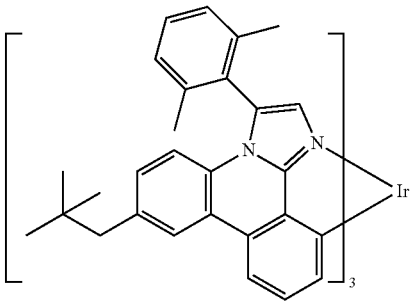

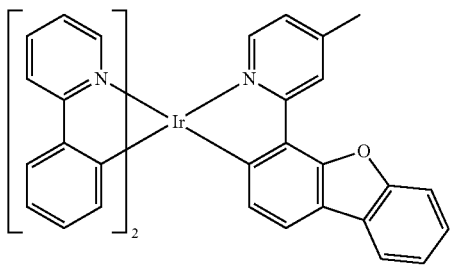

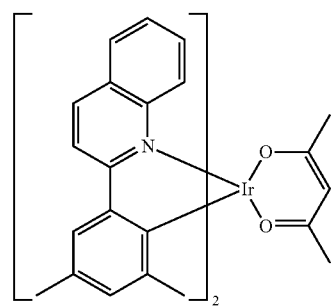

2. Thermally Activated Delayed Fluorescent Light-Emitting Material (TADF):

Traditional organic fluorescent materials can only emit light using 25% of singlet excitons formed by electrical excitation, and the internal quantum efficiency of the device is low (25% at most). Although the phosphorescent material enhances the intersystem crossing due to the strong spin-orbit coupling of the heavy atom center, light emission of the singlet excitons and the triplet excitons formed by the electric excitation can be effectively utilized, and the internal quantum efficiency of the device can reach 100%. However, the problems such as expensive phosphorescent materials, poor material stability, serious device efficiency roll-off and the like have limited the application of the phosphorescent materials in OLEDs. Thermally activated delayed fluorescent light-emitting materials are the third generation of organic light-emitting materials developed after organic fluorescent materials and organic phosphorescent materials. Such materials generally have a small singlet-triplet energy level difference ($\Delta$Est), and the triplet excitons can be converted to singlet excitons to emit light by inverted intersystem crossing. This can make full use of the singlet excitons and the triplet excitons formed under electric excitation. The device can achieve 100% of the internal quantum efficiency.

The TADF material needs to have a small singlet-triplet energy level difference. In one embodiment, the singlet state-triplet state energy level difference ($\Delta$Est) of the TADF material is smaller than 0.3 eV. In another embodiment, the singlet state-triplet state energy level difference ($\Delta$Est) of the TADF material is smaller than 0.2 eV. In another embodiment, the singlet state-triplet state energy level difference ($\Delta$Est) of the TADF material is smaller than 0.1 eV. In another embodiment, the singlet state-triplet state energy level difference ($\Delta$Est) of the TADF material is smaller than 0.05 eV. In one embodiment, the TADF has good fluorescent quantum efficiency. Non-limiting examples of the TADF light-emitting materials can be found in the following patent documents: CN103483332(A), TW201309696(A), TW201309778(A), TW201343874(A), TW201350558(A), US20120217869(A1), WO2013133359(A1), WO2013154064(A1), Adachi, et. al. Adv. Mater., 21, 2009, 4802, Adachi, et. al. Appl. Phys. Lett., 98, 2011, 083302, Adachi, et. al. Appl. Phys. Lett., 101, 2012, 093306, Adachi, et. al. Chem. Commun., 48, 2012, 11392, Adachi, et. al. Nature Photonics, 6, 2012, 253, Adachi, et. al. Nature, 492, 2012, 234, Adachi, et. al. J. Am. Chem. Soc, 134, 2012, 14706, Adachi, et. al. Angew. Chem. Int. Ed, 51, 2012, 11311, Adachi, et. al. Chem. Commun., 48, 2012, 9580, Adachi, et. al. Chem. Commun., 48, 2013, 10385, Adachi, et. al. Adv. Mater., 25, 2013, 3319, Adachi, et. al. Adv. Mater., 25, 2013, 3707, Adachi, et. al. Chem. Mater., 25, 2013, 3038, Adachi, et. al. Chem. Mater., 25, 2013, 3766, Adachi, et. al. J. Mater. Chem. C., 1, 2013, 4599, Adachi, et. al. J. Phys. Chem. A., 117, 2013, 5607. All the contents of the above patents or articles or documents are hereby incorporated by reference.

Non-limiting examples of some suitable TADF light-emitting materials are listed in the table below:

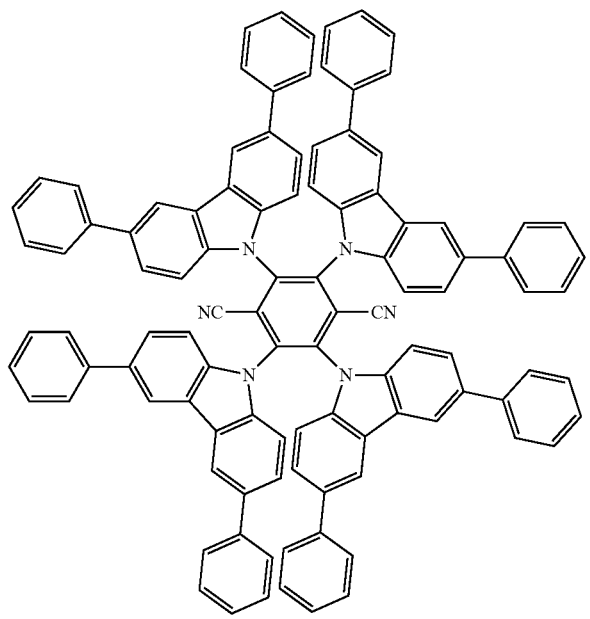 [SMILES: N#Cc1c(-n2c3ccc(-c4ccccc4)cc3c3cc(-c4ccccc4)ccc32)c(-n2c3ccc(-c4ccccc4)cc3c3cc(-c4ccccc4)ccc32)c(C#N)c(-n2c3ccc(-c4ccccc4)cc3c3cc(-c4ccccc4)ccc32)c1-n1c2ccc(-c3ccccc3)cc2c2cc(-c3ccccc3)ccc21]
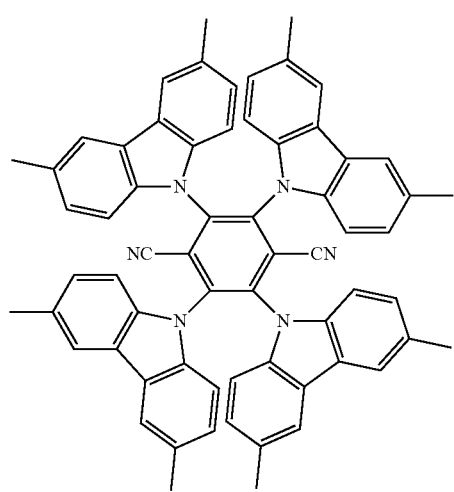

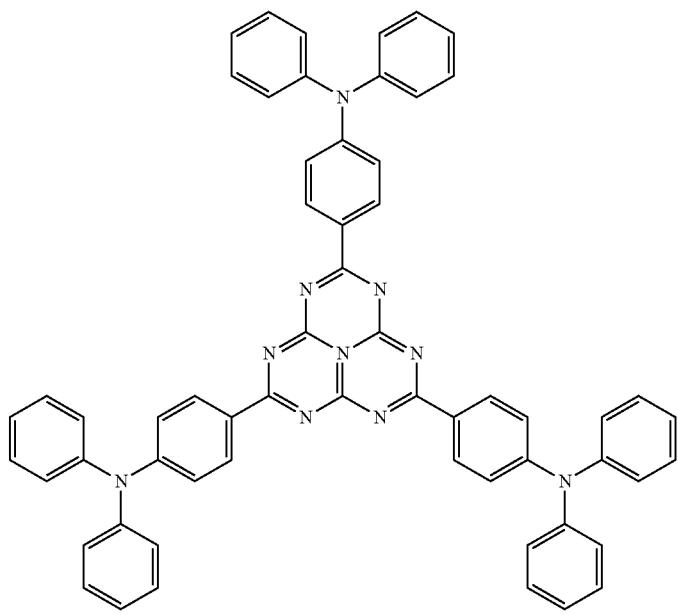
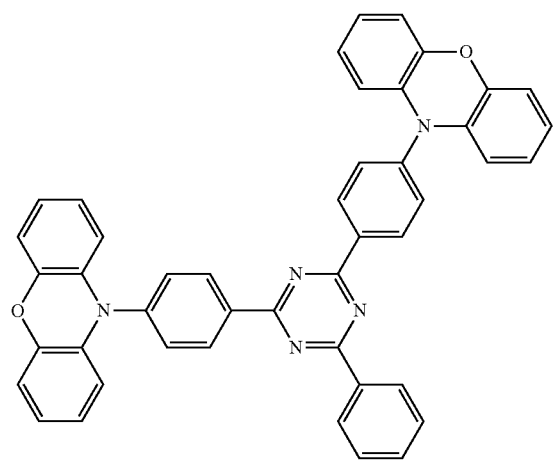 [SMILES: c1ccc(-c2nc(-c3ccc(N4c5ccccc5Oc5ccccc54)cc3)nc(-c3ccc(N4c5ccccc5Oc5ccccc54)cc3)n2)cc1]
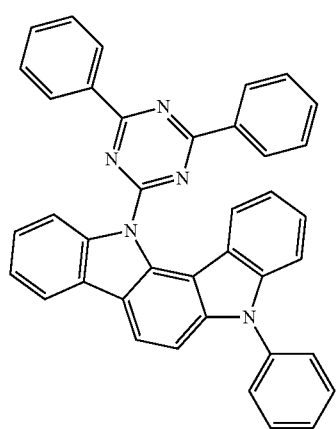 [SMILES: c1ccc(-c2nc(-c3ccccc3)nc(-n3c4ccccc4c4ccc5c(c6ccccc6n5-c5ccccc5)c43)n2)cc1]

-continued
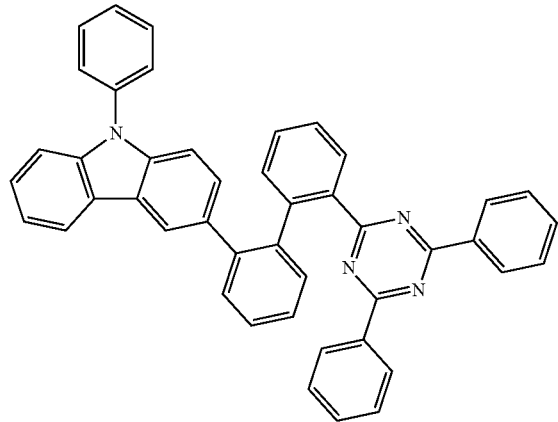 [SMILES: c1ccc(-c2nc(-c3ccccc3)nc(-c3ccccc3-c3ccccc3-c3ccc4c(c3)c3ccccc3n4-c3ccccc3)n2)cc1]
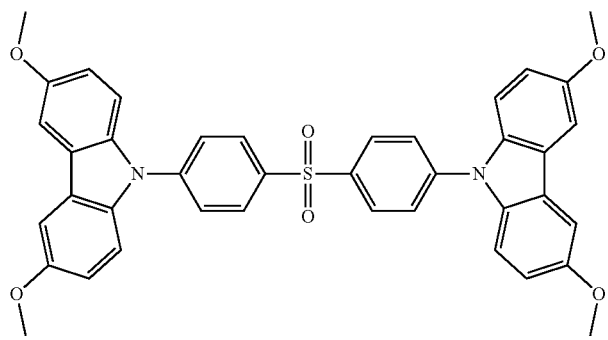 [SMILES: COc1ccc2c(c1)c1cc(OC)ccc1n2-c1ccc(S(=O)(=O)c2ccc(-n3c4ccc(OC)cc4c4cc(OC)ccc43)cc2)cc1]
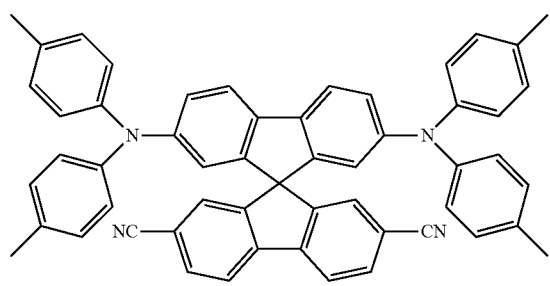
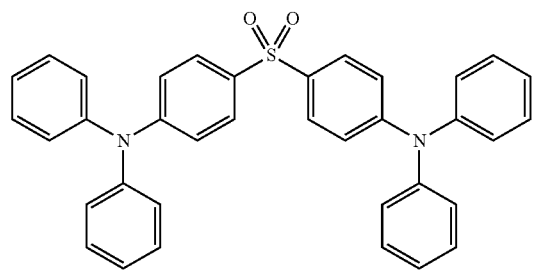 [SMILES: O=S(=O)(c1ccc(N(c2ccccc2)c2ccccc2)cc1)c1ccc(N(c2ccccc2)c2ccccc2)cc1]

-continued
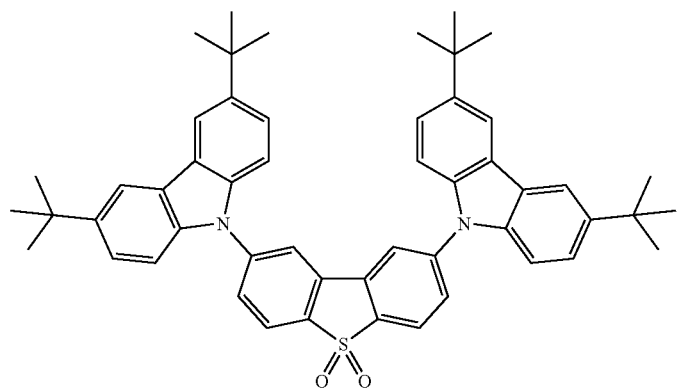 [SMILES: CC(C)(C)c1ccc2c(c1)c1cc(C(C)(C)C)ccc1n2-c1ccc2c(c1)-c1cc(-n3c4ccc(C(C)(C)C)cc4c4cc(C(C)(C)C)ccc43)ccc1S2(=O)=O]
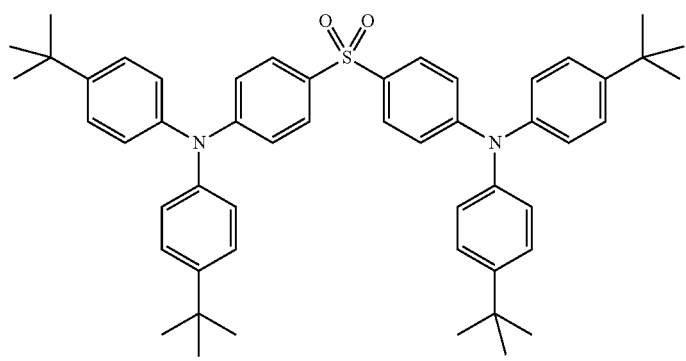 [SMILES: CC(C)(C)c1ccc(N(c2ccc(C(C)(C)C)cc2)c2ccc(S(=O)(=O)c3ccc(N(c4ccc(C(C)(C)C)cc4)c4ccc(C(C)(C)C)cc4)cc3)cc2)cc1]
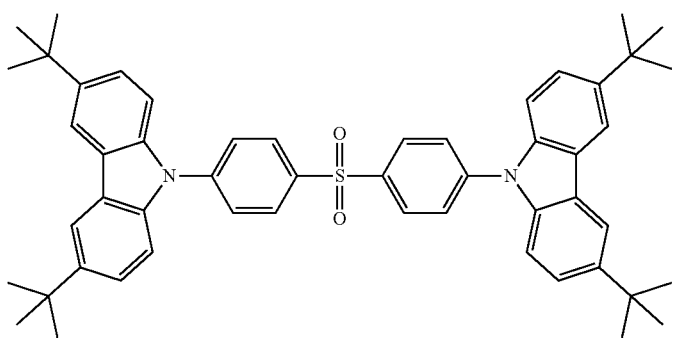 [SMILES: CC(C)(C)c1ccc2c(c1)c1cc(C(C)(C)C)ccc1n2-c1ccc(S(=O)(=O)c2ccc(-n3c4ccc(C(C)(C)C)cc4c4cc(C(C)(C)C)ccc43)cc2)cc1]
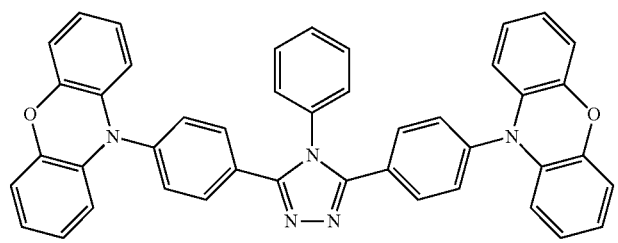 [SMILES: c1ccc(-n2c(-c3ccc(N4c5ccccc5Oc5ccccc54)cc3)nnc2-c2ccc(N3c4ccccc4Oc4ccccc43)cc2)cc1]

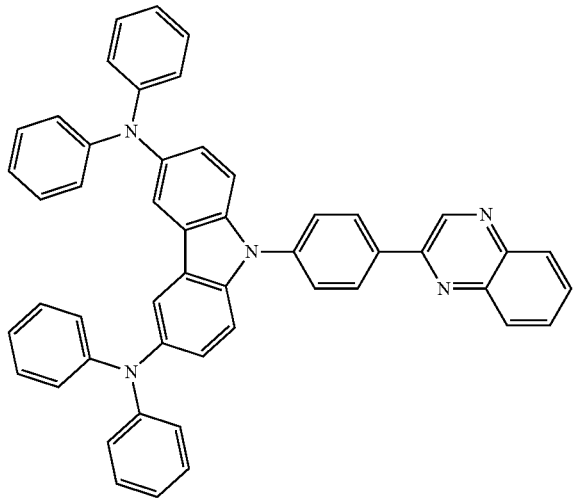 [SMILES: c1ccc(N(c2ccccc2)c2ccc3c(c2)c2cc(N(c4ccccc4)c4ccccc4)ccc2n3-c2ccc(-c3cnc4ccccc4n3)cc2)cc1]
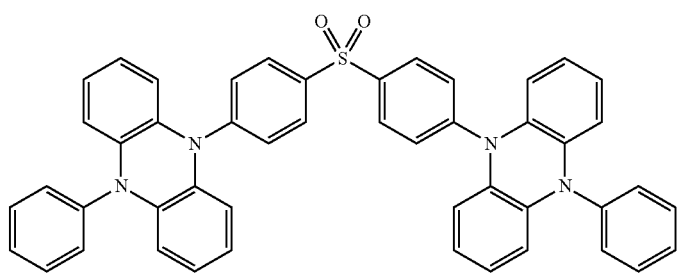 [SMILES: O=S(=O)(c1ccc(N2c3ccccc3N(c3ccccc3)c3ccccc32)cc1)c1ccc(N2c3ccccc3N(c3ccccc3)c3ccccc32)cc1]
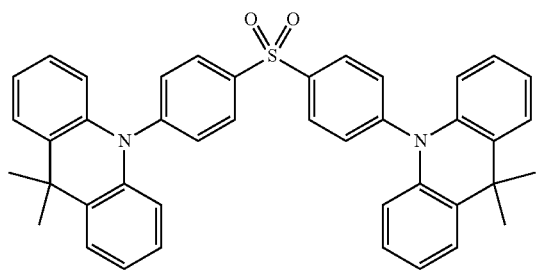
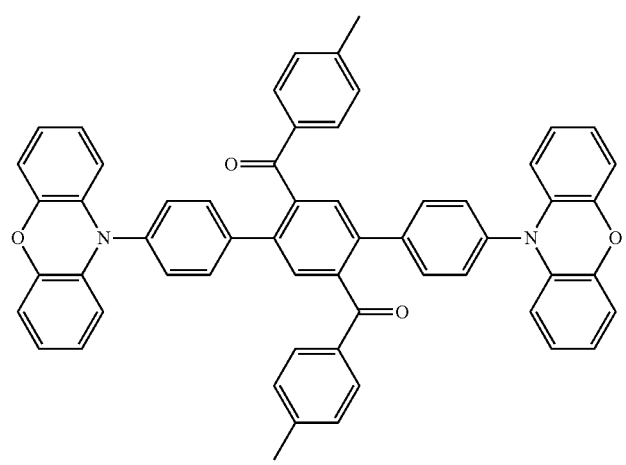 [SMILES: Cc1ccc(C(=O)c2cc(-c3ccc(N4c5ccccc5Oc5ccccc54)cc3)c(C(=O)c3ccc(C)cc3)cc2-c2ccc(N3c4ccccc4Oc4ccccc43)cc2)cc1]

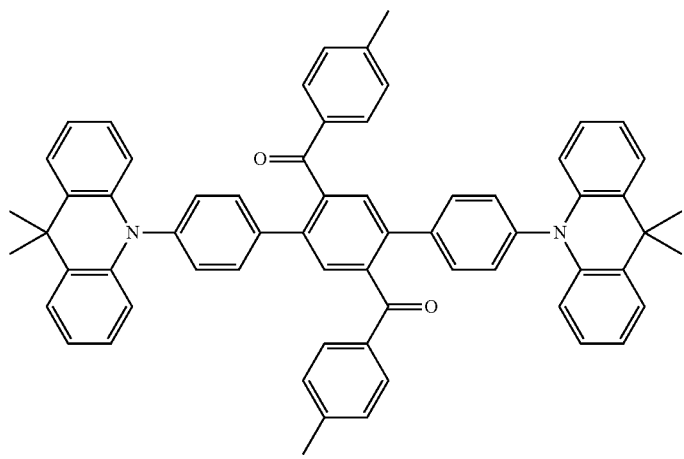
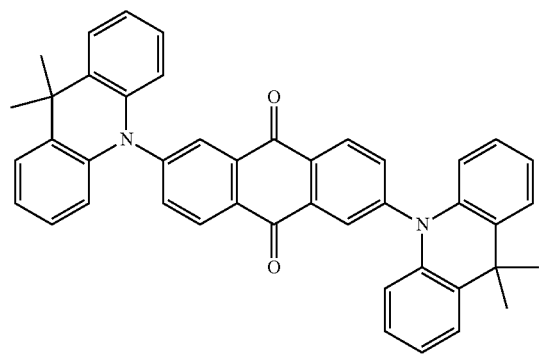
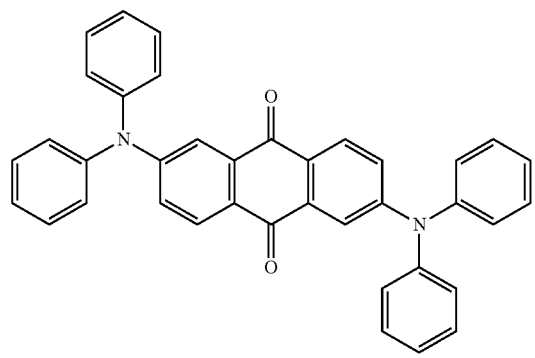 [SMILES: O=C1c2ccc(N(c3ccccc3)c3ccccc3)cc2C(=O)c2ccc(N(c3ccccc3)c3ccccc3)cc21]

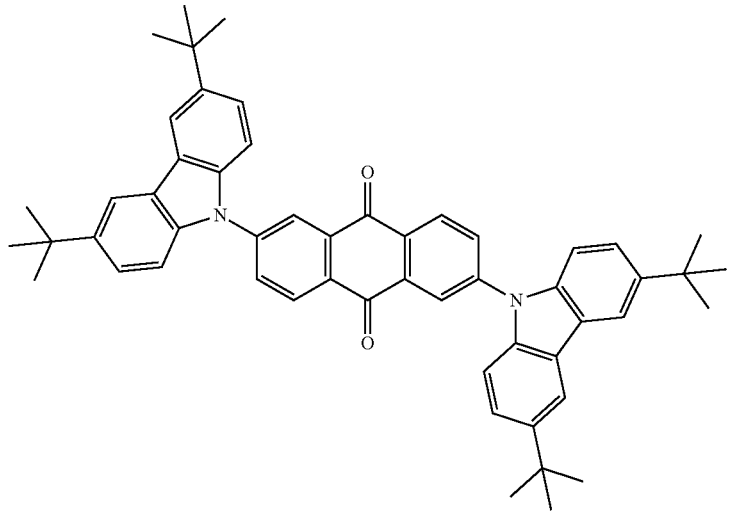 [SMILES: CC(C)(C)c1ccc2c(c1)c1cc(C(C)(C)C)ccc1n2-c1ccc2c(c1)C(=O)c1ccc(-n3c4ccc(C(C)(C)C)cc4c4cc(C(C)(C)C)ccc43)cc1C2=O]
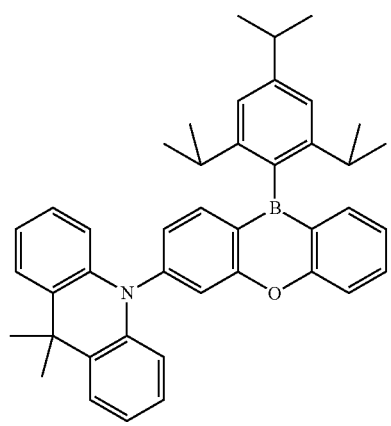 [SMILES: CC(C)c1cc(C(C)C)c(B2c3ccccc3Oc3cc(N4c5ccccc5C(C)(C)c5ccccc54)ccc32)c(C(C)C)c1]
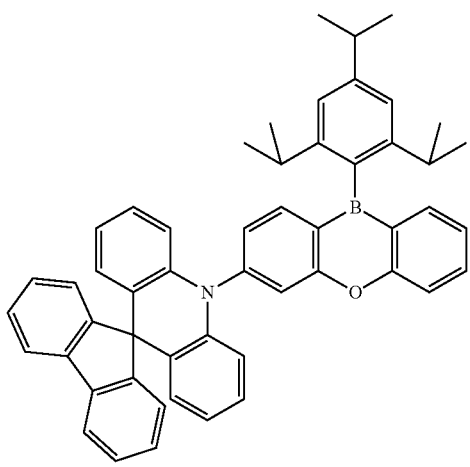 [SMILES: CC(C)c1cc(C(C)C)c(B2c3ccccc3Oc3cc(N4c5ccccc5C5(c6ccccc6-c6ccccc65)c5ccccc54)ccc32)c(C(C)C)c1]

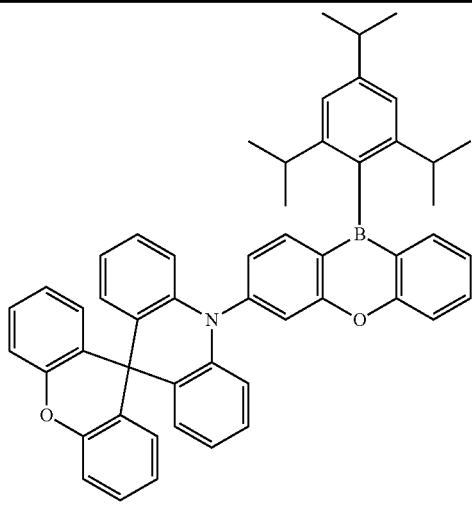
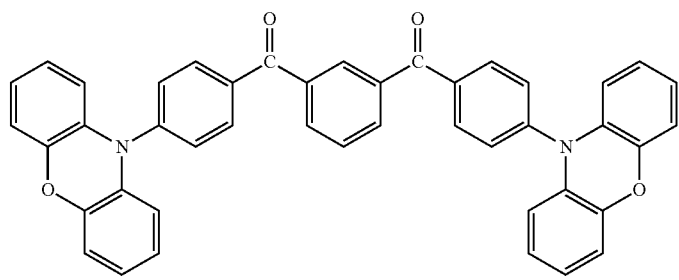 [SMILES: O=C(c1ccc(N2c3ccccc3Oc3ccccc32)cc1)c1cccc(C(=O)c2ccc(N3c4ccccc4Oc4ccccc43)cc2)c1]
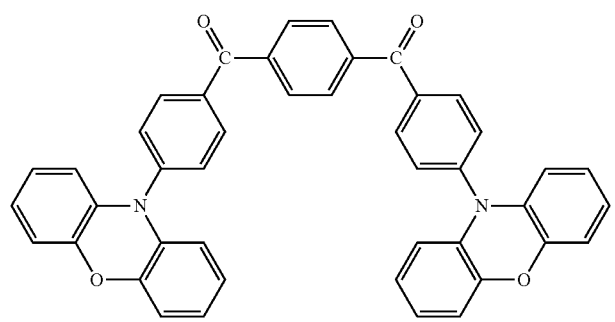 [SMILES: O=C(c1ccc(C(=O)c2ccc(N3c4ccccc4Oc4ccccc43)cc2)cc1)c1ccc(N2c3ccccc3Oc3ccccc32)cc1]
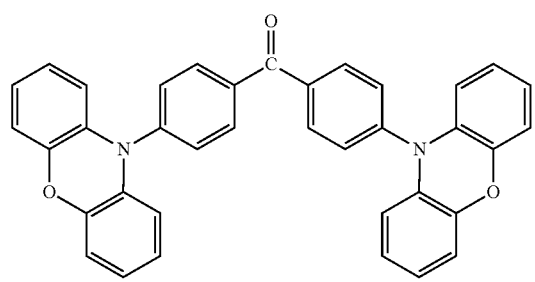 [SMILES: O=C(c1ccc(N2c3ccccc3Oc3ccccc32)cc1)c1ccc(N2c3ccccc3Oc3ccccc32)cc1]

-continued
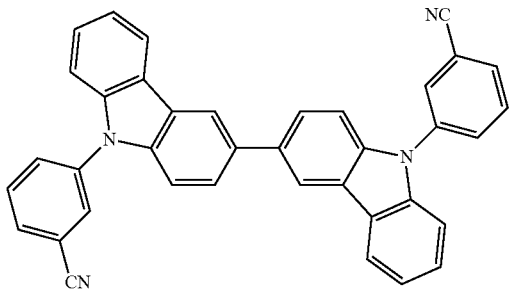 [SMILES: N#Cc1cccc(-n2c3ccccc3c3cc(-c4ccc5c(c4)c4ccccc4n5-c4cccc(C#N)c4)ccc32)c1]
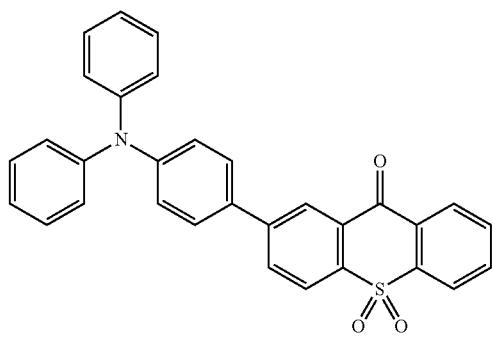 [SMILES: O=C1c2ccccc2S(=O)(=O)c2ccc(-c3ccc(N(c4ccccc4)c4ccccc4)cc3)cc21]
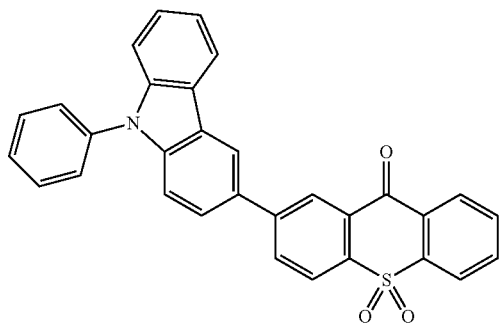 [SMILES: O=C1c2ccccc2S(=O)(=O)c2ccc(-c3ccc4c(c3)c3ccccc3n4-c3ccccc3)cc21]
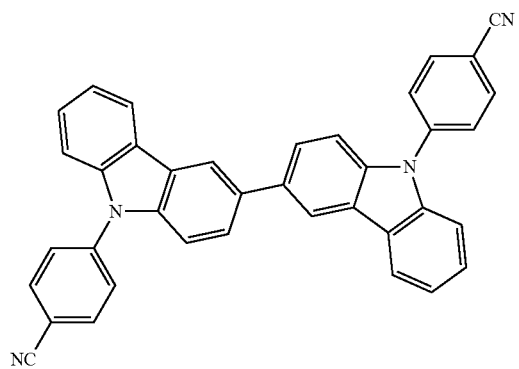 [SMILES: N#Cc1ccc(-n2c3ccccc3c3cc(-c4ccc5c(c4)c4ccccc4n5-c4ccc(C#N)cc4)ccc32)cc1]

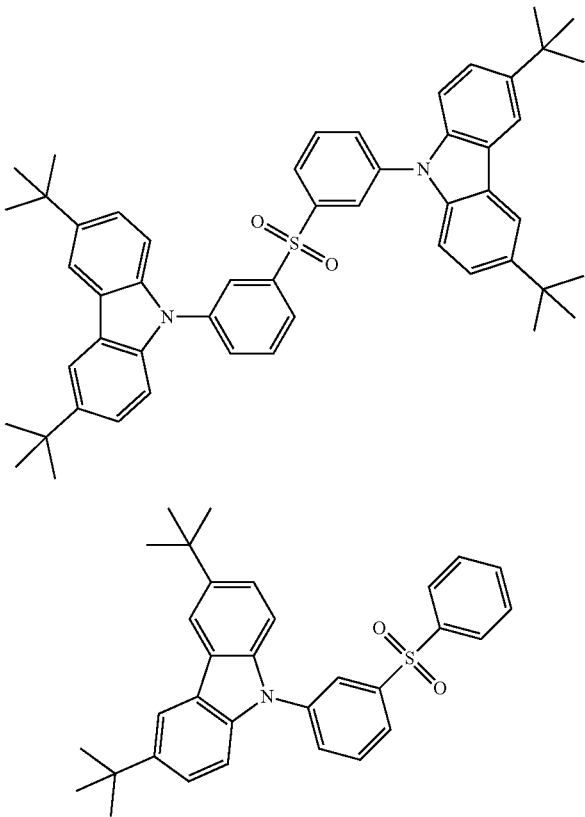

Another aspect of the present disclosure further relates to a formulation or a printing ink comprising the organometallic complex and/or a polymer according to the present disclosure, and at least one organic solvent. Another aspect of the present disclosure further provides a method of preparing, from a solution, a film comprising the organometallic complex or a polymer according to the present disclosure.

Another aspect of the present disclosure further relates to a formulation or a printing ink comprising the organometallic complex and/or a polymer according to the present disclosure, and at least one organic solvent. Another aspect of the present disclosure further provides a method of preparing, from a solution, a film comprising the organometallic complex or polymer according to the present disclosure.

In the present disclosure, the formulation and the printing ink, or the ink have the same meaning, and they are interchangeable.

When used in the printing process, viscosity and surface tension of the ink are important parameters. The surface tension parameters of a suitable ink are suitable for a particular substrate and a particular printing method.

In one embodiment, the surface tension of the ink according to the present disclosure is in the range of about 19 dyne/cm to 50 dyne/cm at an operating temperature or at 25° C. In another embodiment, the surface tension of the ink according to the present disclosure is in the range of 22 dyne/cm to 35 dyne/cm at an operating temperature or at 25° C. In another embodiment, the surface tension of the ink according to the present disclosure is in the range of 25 dyne/cm to 33 dyne/cm at an operating temperature or at 25° C.

In another embodiment, the viscosity of the ink according to the present disclosure is in the range of about 1 cps to 100 cps at an operating temperature or at 25° C. In another embodiment, the viscosity of the ink according to the present disclosure is in the range of 1 cps to 50 cps at an operating temperature or at 25° C. In another embodiment, the viscosity of the ink according to the present disclosure is in the range of 1.5 cps to 20 cps at an operating temperature or at 25° C. In another embodiment, the viscosity of the ink according to the present disclosure is in the range of 4.0 cps to 20 cps at an operating temperature or at 25° C. Formulations so formulated will be suitable for inkjet printing.

The viscosity may be adjusted by different methods, such as by selecting the concentration of functional materials in the ink through a suitable solvent. The ink containing the organometallic complex or polymer according to the present disclosure may facilitate adjustment of the concentration of the printing ink in an appropriate range according to the printing method used. Generally, the formulation according to the present disclosure comprises a functional material in a weight ratio in the range of 0.3% to 30% by weight. In one embodiment, the formulation according to the present disclosure comprises a functional material in a weight ratio in the range of 0.5% to 20% by weight. In another embodiment, the formulation according to the present disclosure comprises a functional material in a weight ratio in the range of 0.5% to 15% by weight. In another embodiment, the formulation according to the present disclosure comprises a functional material in a weight ratio in the range of 0.5% to 10% by weight. In another embodiment, the formulation according to the present disclosure comprises a functional material in a weight ratio in the range of 1% to 5% by weight.

In some embodiments, according to the ink of the present disclosure, the at least one organic solvent is selected from a solvent based on an aromatics or heteroaromatics, in particular an aliphatic chain/ring substituted aromatic solvent, an aromatic ketone solvent, or an aromatic ether solvent.

Examples suitable for the present disclosure are, but not limited to, the solvents based on aromatics or heteroaromatics: p-diisopropylbenzene, pentylbenzene, tetrahydronaphthalene, cyclohexyl benzene, chloronaphthalene, 1,4-dimethylnaphthalene, 3-isopropylbiphenyl, p-cymene, dipentylbenzene, tripentylbenzene, pentyltoluene, o-xylene, m-xylene, p-xylene, o-diethylbenzene, m-diethylbenzene, p-diethylbenzene, 1,2,3,4-tetramethylbenzene, 1,2,3,5-tetramethylbenzene, 1,2,4,5-tetramethylbenzene, butylbenzene, dodecylbenzene, dihexylbenzene, dibutylbenzene, p-diisopropylbenzene, 1-methoxynaphthalene, cyclohexylbenzene, dimethylnaphthalene, 3-isopropylbiphenyl, p-cymene, 1-methylnaphthalene, 1,2,4-trichlorobenzene, 1,3-dipropoxybenzene, 4,4-difluorodiphenylmethane, 1,2-dimethoxy-4-(1-propenyl)benzene, diphenylmethane, 2-phenylpyridine, 3-phenylpyridine, N-methyldiphenylamine 4-isopropylbiphenyl, a, a-dichlorodiphenyl methane, 4-(3-phenylpropyl)pyridine, benzylbenzoate, 1,1-di(3,4-dimethylphenyl)ethane, 2-isopropylnaphthalene, dibenzylether, and etc.; solvents based on ketones: 1-tetralone, 2-tetralone, 2-(phenylepoxy)tetralone, 6-(methoxyl)tetralone, acetophenone, phenylacetone, benzophenone, and derivatives thereof, such as 4-methylacetophenone, 3-methylacetophenone, 2-methylacetophenone, 4-methylphenylacetone, 3-methylphenylacetone, 2-methylphenylacetone, isophorone, 2,6,8-trimethyl-4-nonanone, fenchone, 2-nonanone, 3-nonanone, 5-nonanone, 2-demayone, 2,5-hexanedione, phorone, di-n-amyl ketone; aromatic ether solvents: 3-phenoxytoluene, butoxybenzene, benzylbutylbenzene, p-anisaldehyde dimethyl acetal, tetrahydro-2-phenoxy-2H-pyran, 1,2-dimethoxy 4-(1-propenyl)benzene, 1,4-benzodioxane, 1,3-dipropylbenzene, 2,5-dimethoxytoluene, 4-ethylphenetole, 1,2,4-trimethoxybenzene, 4-(1-propenyl)-1,2-dimethoxybenzene, 1,3-dimethoxybenzene, glycidyl phenyl ether, dibenzyl ether, 4-tert-butylanisole, trans-p-propenylanisole, 1,2-dimethoxybenzene, 1-methoxynaphthalene, diphenyl ether, 2-phenoxymethyl ether, 2-phenoxytetrahydrofuran, ethyl-2-naphthyl ether, pentyl ether, hexyl ether, dioctyl ether, ethylene glycol dibutyl ether, diethylene glycol diethyl ether, diethylene glycol butyl methyl ether, diethylene glycol dibutyl ether, triethylene glycol dimethyl ether, triethylene glycol ethyl methyl ether, triethylene glycol butyl methyl ether, tripropylene glycol dimethyl ether, tetraethylene glycol dimethyl ether; and ester solvents: alkyl octoate, alkyl sebacate, alkyl stearate, alkyl benzoate, alkyl phenylacetate, alkyl cinnamate, alkyl oxalate, alkyl maleate, alkyl lactone, alkyl oleate, and the like.

Further, according to the ink of the present disclosure, the at least one organic solvent may be selected from the group consisting of aliphatic ketones, such as 2-nonanone, 3-nonanone, 5-nonanone, 2-demayone, 2,5-hexanedione, 2,6,8-trimethyl-4-demayone, phorone, di-n-pentyl ketone, and etc.; or aliphatic ethers, such as amyl ether, hexyl ether, dioctyl ether, ethylene glycol dibutyl ether, diethylene glycol diethyl ether, diethylene glycol butyl methyl ether, diethylene glycol dibutyl ether, triethylene glycol dimethyl ether, triethyl ether alcohol ethyl methyl ether, triethylene glycol butyl methyl ether, tripropylene glycol dimethyl ether, tetraethylene glycol dimethyl ether, etc.

In some other embodiments, the printing ink further comprises another organic solvent. Examples of the another organic solvent include, but are not limited to, methanol, ethanol, 2-methoxyethanol, dichloromethane, trichloromethane, chlorobenzene, o-dichlorobenzene, tetrahydrofuran, anisole, morpholine, toluene, o-xylene, m-xylene, p-xylene, 1,4-dioxane, acetone, methyl ethyl ketone, 1,2-dichloroethane, 3-phenoxy toluene, 1,1,1-trichloroethane, 1,1,2,2-tetrachloroethane, ethyl acetate, butyl acetate, dimethylformamide, dimethylacetamide, dimethyl sulfoxide, tetrahydronaphthalene, decalin, indene, and/or mixtures thereof.

In one embodiment, the formulation according to the present disclosure is a solution.

In another embodiment, the formulation according to the present disclosure is a suspension.

Another aspect of the present disclosure also relates to use of the formulation as a coating or a printing ink in the preparation of organic electronic devices, such as by a printing method or a coating method.

Among them, suitable printing or coating techniques may include, but not limited to, ink-jet printing, nozzle printing, typography, screen printing, dip coating, spin coating, blade coating, roll printing, torsion printing, lithography, flexography, rotary printing, spray coating, brush coating or pad printing, slit type extrusion coating, and so on. Preferred are inkjet printing, slit type extrusion coating, nozzle printing and gravure printing.

The solution or suspension may additionally comprise one or more components such as surface active compounds, lubricants, wetting agents, dispersing agents, hydrophobic agents, binders, etc., for adjusting viscosity, film forming properties, improving adhesion, and the like. For more information about printing techniques and their requirements for solutions, such as solvent, concentration, viscosity, etc., see Handbook of Print Media: Technologies and Production Methods, edited by Helmut Kipphan, ISBN 3-540-67326-1.

Based on the above organometallic complexes, the present disclosure also provides application of the organometallic complexes or polymers as described above in organic electronic devices, which may be selected from, but not limited to, organic light-emitting diodes (OLEDs), organic photovoltaic cells (OPVs), organic light-emitting cells (OLEECs), organic field-effect transistors (OFETs), organic light-emitting field-effect transistors, organic lasers, organic spin electronic devices, organic sensors, and organic plasmon emitting diodes, etc., especially the OLEDs. In an embodiment of the present disclosure, the organometallic complexes are used in the light-emitting layers of the OLED devices.

A further aspect of the present disclosure further relates to an organic electronic device comprising at least one organometallic complex or polymer as described above. Generally, the organic electronic device includes at least a cathode, an anode, and a functional layer located between the cathode and the anode, wherein the functional layer contains at least one organometallic complex or polymer as described above. The organic electronic device may be selected from, but not limited to, an organic light-emitting diode (OLED), an organic photovoltaic cell (OPV), an organic light-emitting cell (OLEEC), an organic field-effect transistor (OFET), an organic light-emitting field-effect transistor, an organic laser, an organic spin electronic device, an organic sensor, and an organic plasmon emitting diode.

In a particular embodiment, the organic electronic device is an electroluminescent device, in particular such as OLED, comprising a substrate, an anode, at least one light-emitting layer, and a cathode.

The substrate may be opaque or transparent. Transparent substrates may be used to make transparent light-emitting components. Reference can be made to, for example, Bulovic et al. Nature 1996, 380, p 29, and Gu et al., Appl. Phys. Lett. 1996, 68, p 2606. The substrate may be rigid or elastic. The substrate may be made of plastic, metal, semiconductor wafer or glass. In one embodiment, the substrate has a smooth surface. Substrates free of surface defects are particularly desirable. In another embodiment, the substrate is flexible and may be selected from polymeric films or plastics, with a glass transition temperature (Tg) of 150° C. or above, above 200° C. in another embodiment, above 250° C. in another embodiment, and above 300° C. in a particularly embodiment. Non-limiting examples of suitable flexible substrates are poly(ethylene terephthalate) (PET) and polyethylene glycol (2,6-naphthalene) (PEN).

The anode may comprise a conductive metal or a metal oxide, or a conductive polymer. The anode may easily inject holes into the hole-injection layer (HIL), the hole-transport layer (HTL) or the light-emitting layer. In one embodiment, the absolute value of the difference between the work function of the anode and the HOMO energy level or the valence band energy level of the emitter in the light-emitting layer as the p-type semiconductive material of the HIL, the HTL, or the electron-blocking layer (EBL) is less than 0.5 eV in one embodiment, less than 0.3 eV in another embodiment, and less than 0.2 eV in another embodiment. Examples of anode materials include, but are not limited to, Al, Cu, Au, Ag, Mg, Fe, Co, Ni, Mn, Pd, Pt, ITO, aluminum-doped zinc oxide (AZO), and the like. Other suitable anode materials are known and may be readily selected for use by one of ordinary skill in the art. The anode material may be deposited using any suitable techniques, such as a suitable physical vapor deposition method, including radio frequency magnetron sputtering, vacuum thermal evaporation, electron beam (e-beam), and the like. In some embodiments, the anode is patterned. The patterned ITO conductive substrate is commercially available and may be used to fabricate the device according to the present disclosure.

The cathode may comprise a conductive metal or a metal oxide. The cathode may easily inject electrons into the EIL or ETL or directly into the light-emitting layer. In one embodiment, the absolute value of the difference between the work function of the cathode and the LUMO energy level or the conduction band energy level of the emitter in the light-emitting layer as the n-type semiconductive material of the electron-injection layer (EIL), the electron-transport layer (ETL) or the hole-blocking layer (HBL) is less than 0.5 eV in one embodiment, less than 0.3 eV in another embodiment, and less than 0.2 eV in another embodiment. In principle, all of the materials that may be used as the cathodes for the OLEDs may serve as the cathode materials for the device of the present disclosure. Examples of the cathode materials include, but are not limited to, Al, Au, Ag, Ca, Ba, Mg, LiF/Al, MgAg alloys, BaF2/Al, Cu, Fe, Co, Ni, Mn, Pd, Pt, ITO, and the like. The cathode materials may be deposited using any suitable techniques, such as a suitable physical vapor deposition method, including radio frequency magnetron sputtering, vacuum thermal evaporation, e-beam, and the like.

The OLEDs may also comprise other functional layers such as a hole-injection layer (HIL), a hole-transport layer (HTL), an electron-blocking layer (EBL), an electron-injection layer (EIL), an electron-transport layer (ETL), and a hole-blocking layer (HBL). Materials suitable for use in these functional layers are described above in detail.

In one embodiment, in the organic electronic device according to the present disclosure, the light-emitting layer thereof comprises the organometallic complex or polymer according to the present disclosure, and in another embodiment the light-emitting layer is prepared by a solution processing method.

The organic electronic device according to the present disclosure has a light emission wavelength between 300 and 1000 nm. In one embodiment, the organic electronic device according to the present disclosure has a light emission wavelength between 350 and 900 nm. In another embodiment, the organic electronic device according to the present disclosure has a light emission wavelength between 400 and 800 nm.

Another aspect of the present disclosure also relates to application of the organic electronic device according to the present disclosure in a variety of electronic devices including, but not limited to, display devices, lighting devices, light sources, sensors, and the like.

The disclosure will be described below with reference to the preferred embodiments, but the disclosure is not limited to the following embodiments. It should be understood that the appended claims are intended to summarize the scope of the present disclosure. Those skilled in the art should understand that modifications can be made to various embodiments of the disclosure with the teaching of the concept provided by the present disclosure, which will be covered by the spirit and scope of the claims of the disclosure.

EXAMPLES

1. Organometallic Complexes and Energy Structures Thereof

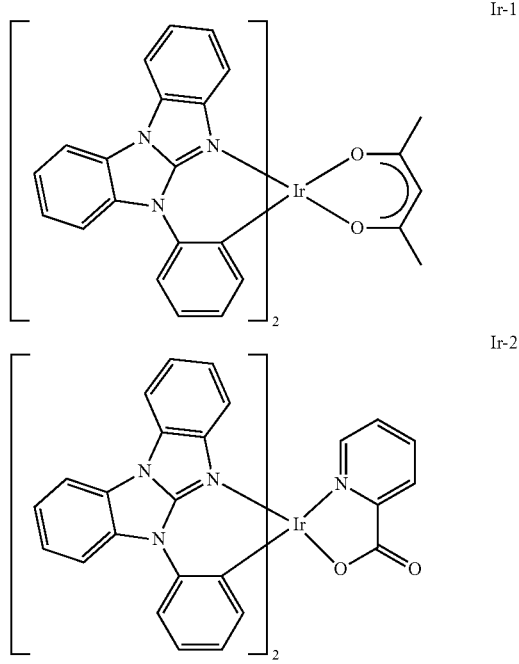

-continued

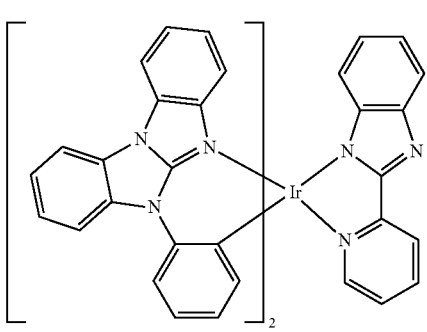

Ir-3

The energy level of the metal organic complex Ir-1-Ir-3 can be obtained by quantum computation, for example, by using TD-DFT (time-dependent density functional theory) by Gaussian03W (Gaussian Inc.), and specific simulation methods can be found in WO2011141110. First, the molecular geometry is optimized by semi-empirical method "Ground State/Hartree-Fock/Default Spin/LanL2 MB" (Charge 0/Spin Singlet), and then the energy structure of organic molecules is determined by TD-DFT (time-dependent density functional theory) Count "TD-SCF/DFT/Default Spin/B3PW91/gen geom=communication pseudo=lanl2" (Charge 0/Spin Singlet). The HOMO and LUMO energy levels are calculated using the following calibration formula, and SI and TI are used directly HOMO(eV)=((HOMO(Gaussian)×27.212)−0.9899)/1.1206

LUMO(eV)=((LUMO(Gaussian)×27.212)−2.0041)/1.385 wherein HOMO(G) and LUMO(G) are the direct calculation results of Gaussian 03W, in units of Hartree. The results are shown in Table 1:

TABLE 1

| Materials | HOMO [eV] | LUMO [eV] | T1 [eV] | S1 [eV] |
|---|---|---|---|---|
| Ir-1 | −5.10 | −1.90 | 2.84 | 3.35 |
| Ir-2 | −5.32 | −2.55 | 2.55 | 2.77 |
| Ir-3 | −5.14 | −2.41 | 2.40 | 2.77 |

2. Synthesis of Organometallic Complexes

Synthesis Implementation Example 1: Synthesis of Compound Ir-1

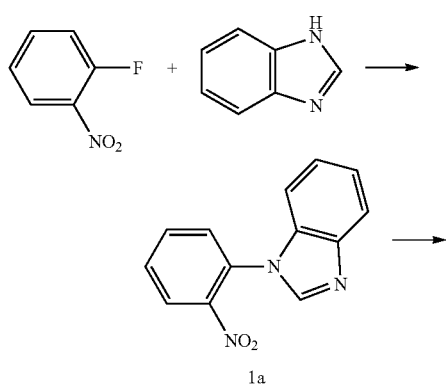

1a

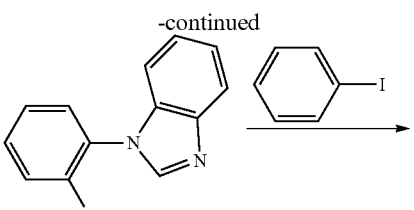

1b

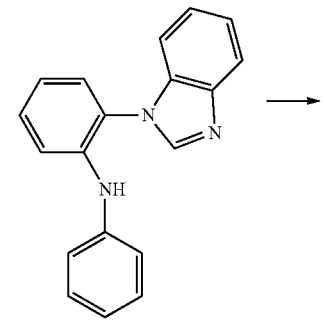

1c

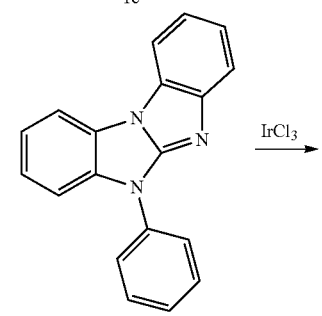

1d

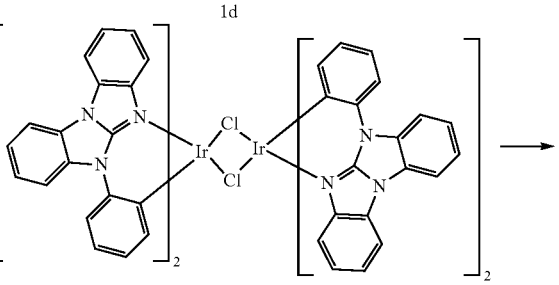

1e

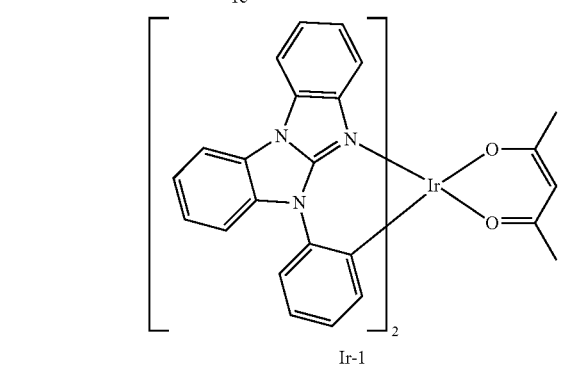

Ir-1

Synthesis of Intermediate 1a

Benzoimidazole (2.83 g, 24 mmol), cuprous iodide (38 mg, 0.2 mmol), potassium carbonate (3.32 g, 24 mmol), fluorinated nitrobenzene (2.82 g, 20 mmol), and 20 mL of DMF were subjected to a reflux reaction in the presence of a nitrogen gas for 24 hours, and cooled to room temperature. Water was added to the reaction solution which was extracted with ethyl acetate. The organic phase was then washed with water, and finally dried over anhydrous magnesium sulfate, concentrated, and then purified by column chromatography with ethyl acetate and petroleum ether in a ratio of 2:1 to yield 1a (5.15 g).

Synthesis of Intermediate 1b

Intermediate 1a (4.78 g, 20 mmol) and Fe powder (4.48 g, 80 mmol) were placed in a 250 mL single-necked round-bottom flask, and then they were dissolved in a mixed solution of 30 mL of anhydrous ethanol, 30 mL of glacial acetic acid and 20 mL of water, followed by addition of 4 drops of concentrated hydrochloric acid dropwise, and stirring at 100° C. for reaction for 3 hours. The reaction solution was cooled to room temperature and suction filtered. The filtrate was extracted several times with dichloromethane. The organic solution was combined, and then accessed with aqueous $Na_2CO_3$ solution and concentrated to yield 1b (3.76 g).

Synthesis of Intermediate 1c

Intermediate 1b (5 g, 24 mmol), copper iodide (0.47 g, 2.4 mmol), potassium carbonate (3.31 g, 24 mmol), iodobenzene (4.89 g, 24 mmol), and DMF (50 mL) were subjected to a reflux reaction in the presence of a nitrogen gas for 24 hours, and cooled to room temperature. Water was added to the reaction solution which was extracted with ethyl acetate. The organic phase was then washed with water, and finally dried over anhydrous magnesium sulfate, concentrated, and then recrystallized with anhydrous ethanol, to yield 1c (4.05 g).

Synthesis of Intermediate 1d

Intermediate 1c (15 g, 52 mmol), copper acetate (2.4 g, 12 mmol), phenanthroline (4.32 g, 24 mmol), sodium acetate (19.2 g, 234 mmol), and m-xylene (400 mL) were reacted in the presence of an oxygen gas at 150° C. for 24 hours, cooled to room temperature, distilled to yield m-xylene under reduced pressure, extracted with dichloromethane, concentrated, and purified by column chromatography with ethyl acetate and petroleum ether in a ratio of 1:5, to yield 1 d (9 g).

Synthesis of Intermediate 1e

Intermediate 1d (0.45 g, 1.6 mmol) and iridium trichloride hydrate (0.23 g, 0.66 mmol) were placed in a dry two-necked flask. Then the two-necked flask was evacuated then filled with nitrogen, which was repeated three times, followed by the addition of a mixture solution of 10 mL of ethylene glycol monoethyl ether and 3 mL of water. The reaction solution was stirred at 110° C. for 24 hours, then cooled to room temperature, suction filtered, washed with n-hexane and dried, and entered into the next step of reaction without further purification.

Synthesis of Compound Ir-1

The intermediate 1e (0.158 g, 0.1 mmol), acetylacetone (0.1 mL, 1 mmol) and $Na_2CO_3$ (0.106 g, 1 mmol) were placed in a dry two-necked flask. Then the two-necked flask was evacuated then filled with nitrogen, which was repeated three times, followed by the addition of 10 mL ethylene glycol monoethyl ether. The reaction solution was stirred under reflux overnight, then cooled to room temperature, followed by the addition of water. Then the reaction solution was extracted with dichloromethane, then dried, concentrated and purified by column chromatography with dichloromethane to yield Ir-1 (0.04 g)

Synthesis Implementation Example 2: Synthesis of Compound Ir-2

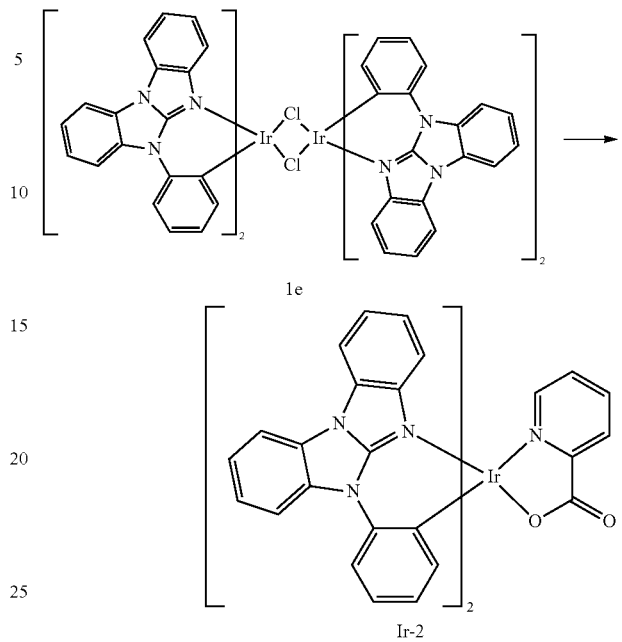

The intermediate 1e (0.158 g, 0.1 mmol), 2-pyridine acid (24.6 mg, 0.2 mmol), and $Na_2CO_3$ (0.106 g, 1 mmol) were placed in a dry two-necked flask. Then the two-necked flask was evacuated then filled with nitrogen, which was repeated three times, followed by the addition of 10 mL ethylene glycol monoethyl ether. The reaction solution was stirred under reflux overnight, then cooled to room temperature, followed by the addition of water. Then the reaction solution was extracted with dichloromethane, then dried, concentrated and purified by column chromatography with ethyl acetate and dichloromethane in a ratio of 1:2, to yield Ir-2 (0.06 g).

Synthesis Implementation Example 2: Synthesis of Compound Ir-3

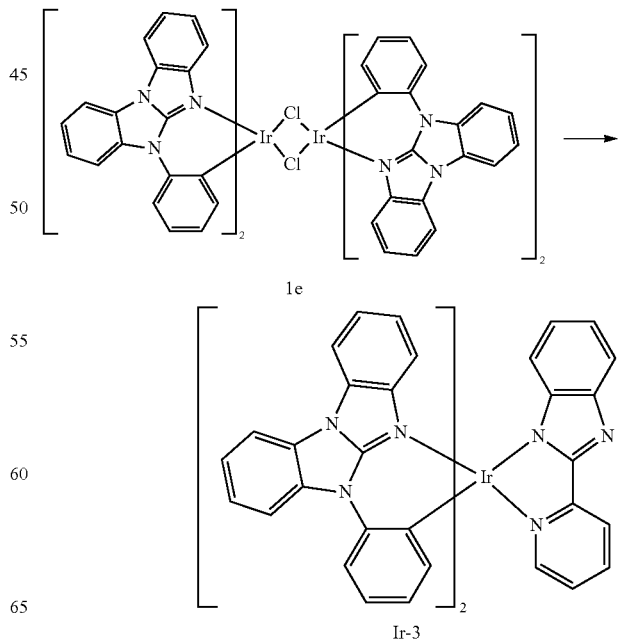

The intermediate 1e (0.158 g, 0.1 mmol) and 2-pyridine benzoimidazole (39 mg, 0.2 mmol) were placed in a dry two-necked flask. Then the two-necked flask was evacuated then filled with nitrogen, which was repeated three times, followed by the addition of a mixture solution of 5 mL dichloromethane and 5 mL methanol. The reaction solution was stirred under reflux overnight, then cooled to room temperature, followed by the addition of water. Then the reaction solution was extracted with dichloromethane, then dried, concentrated and purified by column chromatography with ethyl acetate and dichloromethane in a ratio of 1:2, to yield Ir-3 (0.06 g).

3. Preparation and Characterization of OLED Devices

OLED devices with ITO/NPD (60 nm)/15% Ir-1~Ir-3: mCP (45 nm)/TPBi (35 nm)/LiF (1 nm)/Al (150 nm)/ cathode were prepared as follows:

a. Cleaning of conductive glass substrates: when used for the first time, a variety of solvents, such as chloroform, ketone, and isopropyl alcohol, may be used for cleaning, followed by UV ozone plasma treatment;

b. HTL (60 nm), EML (45 nm), and ETL (35 nm): they were obtained by thermal evaporation in high vacuum ($1 \times 10^{-6}$ mbar);

c. A cathode: LiF/Al (1 nm/150 nm) was obtained in high vacuum ($1 \times 10^{-6}$ mbar) by thermal evaporation;

d. Encapsulation: the devices were encapsulated in a nitrogen glove box with UV-curable resins.

The current-voltage-luminance (JVL) characteristics of each OLED device were characterized by a characterization apparatus while important parameters such as efficiency and external quantum efficiency were recorded. Upon detection, the maximum external quantum efficiencies of OLEDs 1-3 (corresponding to organometallic complexes Ir-1 to Ir-3) were 8.7%, 14.2%, and 12.4%, respectively.

Further optimization, such as optimization of device structure, and combination optimization of HTM, ETM and host materials, will further improve the performance of the device, especially the efficiency, the drive voltage, and the service life.

It should be understood that application of the present disclosure is not limited to the above examples, and can be modified or changed by those skilled in the art according to the above description. All these modifications and transformations should fall within the protection scope of the appended claims of the present disclosure.

What is claimed is:

1. An organometallic complex having the structure represented by any one of the following formulas:

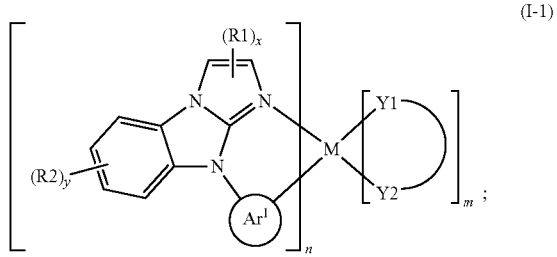
(I-1)

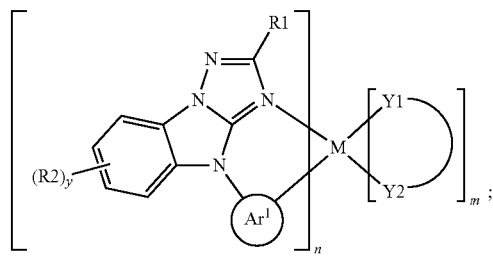
(I-2)

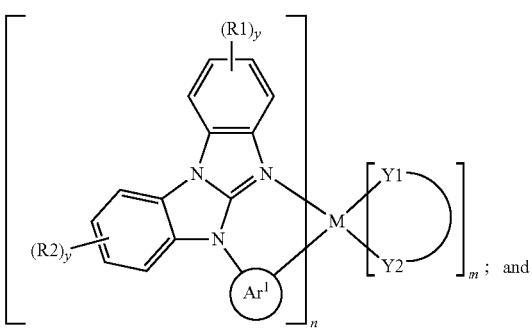
(I-3)

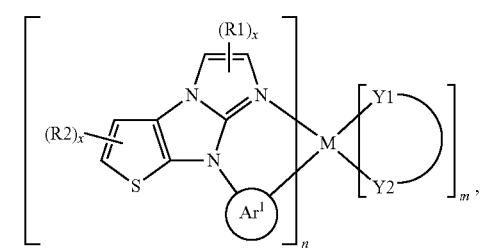
(I-4)

where M is a transition metal element;
m is an integer from 1 to 2, and n is an integer from 1 to 3;
Ar$^1$ is an aromatic hydrocarbon or heteroaromatic cyclic hydrocarbon system which is not substituted or is substituted by R$^1$;
R$^1$ is selected from the group consisting of H, D, linear alkyl containing 1 to 20 carbon atoms, linear alkoxy containing 1 to 20 carbon atoms, linear thioalkoxy containing 1 to 20 carbon atoms, branched or cyclic alkyl containing 3 to 20 carbon atoms, branched or cyclic alkoxy containing 3 to 20 carbon atoms, branched or cyclic thioalkoxy containing 3 to 20 carbon atoms or branched, cyclic silyl containing 3 to 20 carbon atoms, a substituted keto group containing 1 to 20 carbon atoms, alkoxycarbonyl containing 2 to 20 carbon atoms, aryloxycarbonyl containing 7 to 20 carbon atoms, cyano, carbamoyl, haloformyl, formyl, isocyano, an isocyanate group,; a thiocyanate group, an isothiocyanate group, hydroxy, nitro, CF$_3$, Cl, Br, F, a crosslinkable group, a substituted or unsubstituted aromatic or heteroaromatic ring system containing 5 to 40 ring-forming atoms, and aryloxy or heteroaryloxy containing 5 to 40 ring-forming atoms;

is a bidentate ligand;
x is an integer from 0 to 2;
y is an integer from 0 to 4;

R[1] and R[2] are each independently selected from the group consisting of H, F, Cl, Br, I, D, C.N., NO$_2$, CF$_3$, B(OR$^2$)$_2$, Si(R$^2$)$_3$, linear alkane, alkane ether, alkane thioether containing 1 to 10 carbon atoms, branched alkane, cycloalkane, and aryl containing 6 to 10 carbon atoms; and R[2] is independently selected from the group consisting of H, D, linear alkyl containing 1 to 20 carbon atoms, linear alkoxy containing 1 to 20 carbon atoms, linear thioalkoxy containing 1 to 20 carbon atoms, branched or cyclic alkyl containing 3 to 20 carbon atoms, branched or cyclic alkoxy containing 3 to 20 carbon atoms, branched or cyclic thioalkoxy containing 3 to 20 carbon atoms or branched, cyclic silyl containing 3 to 20 carbon atoms, a substituted keto group containing 1 to 20 carbon atoms, alkoxycarbonyl containing 2 to 20 carbon atoms, aryloxycarbonyl containing 7 to 20 carbon atoms, cyano, carbamoyl, haloformyl, formyl, isocyano, an isocyanate group, a thiocyanate group, an isothiocyanate group, hydroxy, nitro, CF$_3$, Cl, Br, F, a crosslinkable group, a substituted or unsubstituted aromatic or heteroaromatic ring system containing 5 to 40 ring-forming atoms, and aryloxy or heteroaryloxy containing 5 to 40 ring-forming atoms.

2. The organometallic complex according to claim 1, wherein Ar[1] is selected from the group consisting of benzene, naphthalene, anthracene, phenanthrene, perylene, tetracene, pyrene, benzopyrene, triphenylene, acenaphthene, fluorene, furan, benzofuran, thiophene, benzothiophene, pyrrole, pyrazole, triazole, imidazole, oxazole, oxadiazole, thiazole, tetrazole, indole, carbazole, pyrroloimidazole, pyrrolopyrrole, thienopyrrole, thienothiophene, furopyrrole, furofuran, thienofuran, benzoisoxazole, benzoisothiazole, benzoimidazole, pyridine, pyrazine, pyridazine, pyrimidine, triazine, quinoline, isoquinoline, o-diazonaphthalene, quinoxaline, phenanthridine, perimidine, quinazoline, quinazolinone, and derivatives thereof.

3. The organometallic complex according to claim 1, wherein Ar[1] has the structure represented by any one of the following general formulas:

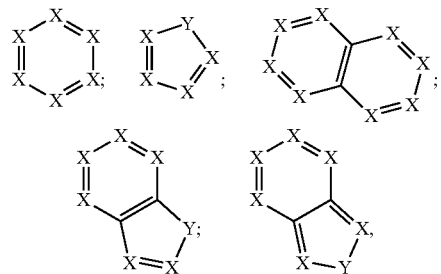

wherein,
X is CR[1] or N;
Y is selected from the group consisting of CR$^2$R$^3$, SiR$^2$R$^3$, NR[2], C(=O), S, and O;
R[3] is independently selected from the group consisting of H, D, linear alkyl containing 1 to 20 carbon atoms, linear alkoxy containing 1 to 20 carbon atoms, linear thioalkoxy containing 1 to 20 carbon atoms, branched or cyclic alkyl containing 3 to 20 carbon atoms, branched or cyclic alkoxy containing 3 to 20 carbon atoms, branched or cyclic thioalkoxy containing 3 to 20 carbon atoms or branched, cyclic silyl containing 3 to 20 carbon atoms, a substituted keto group containing 1 to 20 carbon atoms, alkoxycarbonyl containing 2 to 20 carbon atoms, aryloxycarbonyl containing 7 to 20 carbon atoms, cyano, carbamoyl, haloformyl, formyl, isocyano, an isocyanate group, a thiocyanate group, an isothiocyanate group, hydroxy, nitro, CF$_3$, Cl, Br, F, a crosslinkable group, a substituted or unsubstituted aromatic or heteroaromatic ring system containing 5 to 40 ring-forming atoms, and aryloxy or heteroaryloxy containing 5 to 40 ring-forming atoms.

4. The organometallic complex according to claim 3, wherein Ar[1] is selected from the group consisting of the following structural units and substituted thereof:

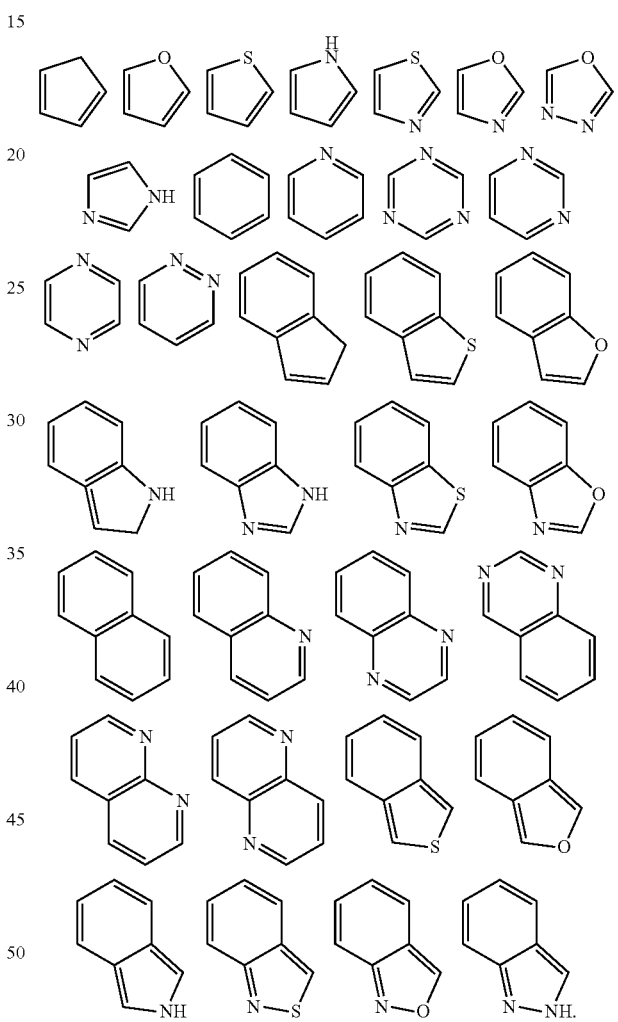

5. The organometallic complex according to claim 1, wherein when n>1, Ar[1] is independently selected from the group consisting of the following general formula C1 to C5,

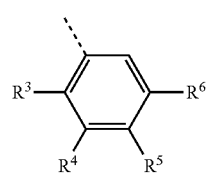

C1

-continued

C2
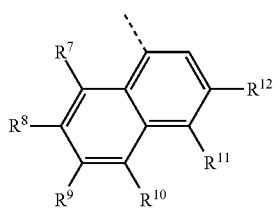

C3
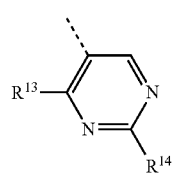

C4
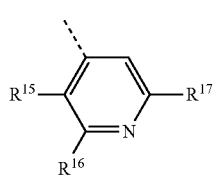

C5
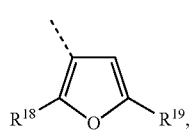

wherein $R^3$ to $R^{19}$ are each independently selected from the group consisting of H, F, Cl, Br, I, D, C.N., $NO_2$, $CF_3$, $B(OR^2)_2$, $Si(R^2)_3$, linear alkane, alkane ether, alkane thioether containing 1 to 10 carbon atoms, branched alkane, cycloalkane, and aryl containing 6 to 10 carbon atoms, and each of dash lines indicates that connection is carried out in the form of a single bond.

6. The organometallic complex according to claim 1, wherein m>1,

is a monoanionic ligand, which is independently selected from the group consisting of the following general formulas L1 to L15, L1
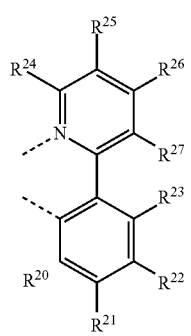

-continued

L2
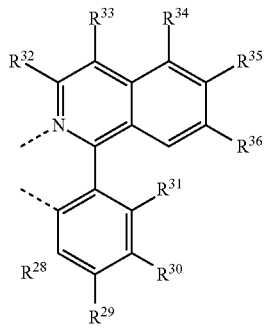

L3
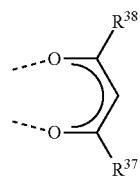

L4
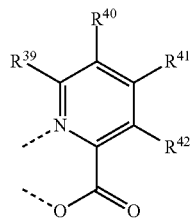

L5
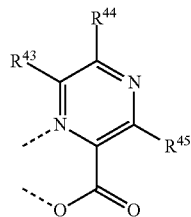

L6
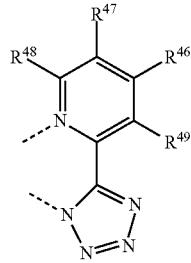

L7
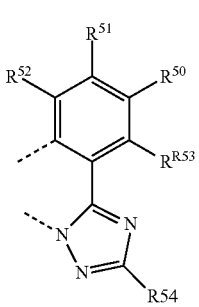

L8

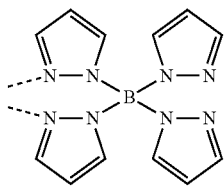

L9

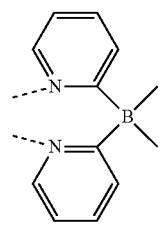

L10

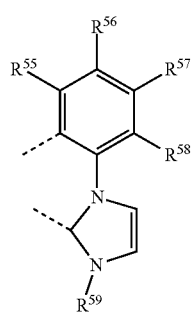

L11

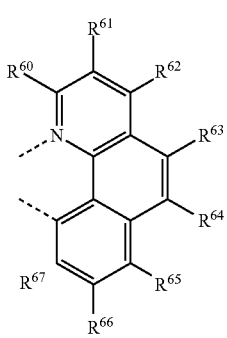

L12

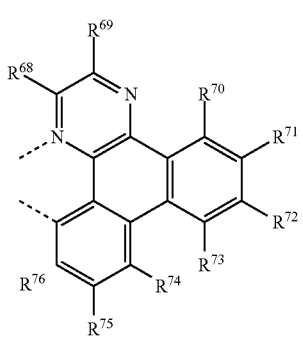

L13

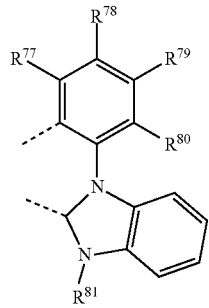

L14

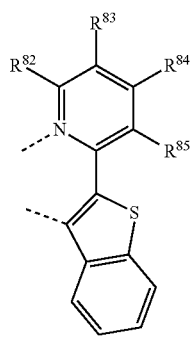

L15

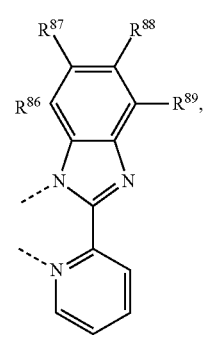

where $R^{20}$ to $R^{89}$ are each independently selected from the group consisting of H, F, Cl, Br, I, D, C.N., $NO_2$, $CF_3$, $B(OR^2)_2$, $Si(R^2)_3$, linear alkane, alkane ether, alkane thioether containing 1 to 10 carbon atoms, branched alkane, cycloalkane, and aryl containing 6 to 10 carbon atoms, and each of dash lines indicates a single bond connected to the transition metal element M.

7. The organometallic complex according to claim 1, wherein the transition metal element M is selected from the group consisting of chromium, molybdenum, tungsten, ruthenium, rhodium, nickel, argentum, copper, zinc, palladium, gold, osmium, rhenium, iridium, and platinum.

8. The organometallic complex according to claim 1, wherein the transition metal element M is iridium or platinum.

9. The organometallic complex according to claim 1, wherein the transition metal element M is iridium.

10. The organometallic complex according to claim 1, wherein the organometallic complex is emissive with an emission wavelength in a range from 300nm to 1000 nm.

11. The organometallic complex according to claim 1, wherein the organometallic complex has a photoluminescent efficiency larger or equal to ≥30%.

12. A mixture, comprising:
the organometallic complex according to claim 1; and
at least one organic functional material selected from the group consisting of a hole-injection material, a hole-transport material, an electron-transport material, an electron-injection material, an electron-blocking material, a hole-blocking material, an emitter, a host material, and an organic dye.

13. The mixture according to claim 12, wherein the content of the organometallic complex is between 0.01 to 30 wt%.

14. A mixture, comprising the organometallic complex according to claim 1, and a polymer or a triplet host material or a triplet emitter.

15. An organic electronic device, comprising the organometallic complex according to claim 1.

16. The organic electronic device according to claim 15, wherein the organic electronic device is selected from the group consisting of an organic light-emitting diode, an organic photovoltaic cell, an organic light-emitting electrochemical cell, an organic field-effect transistor, an organic light-emitting field-effect transistor, an organic laser, an organic spin electronic device, an organic sensor, and an organic plasmon emitting diode.

* * * * *